US011187789B2

United States Patent
Burroughs et al.

(10) Patent No.: US 11,187,789 B2
(45) Date of Patent: Nov. 30, 2021

(54) DEVICES INCORPORATING INTEGRATED DETECTORS AND ULTRA-SMALL VERTICAL CAVITY SURFACE EMITTING LASER EMITTERS

(71) Applicant: Sense Photonics, Inc., Durham, NC (US)

(72) Inventors: Scott Burroughs, Raleigh, NC (US); Brent Fisher, Bethesda, MD (US); James Carter, Chapel Hill, NC (US)

(73) Assignee: Sense Photonics, Inc., Durham, NC (US)

( * ) Notice: Subject to any disclaimer, the term of this patent is extended or adjusted under 35 U.S.C. 154(b) by 176 days.

(21) Appl. No.: 15/951,884

(22) Filed: Apr. 12, 2018

(65) Prior Publication Data
US 2018/0301589 A1 Oct. 18, 2018

Related U.S. Application Data

(60) Provisional application No. 62/484,701, filed on Apr. 12, 2017, provisional application No. 62/613,985, filed on Jan. 5, 2018.

(51) Int. Cl.
*G01S 7/481* (2006.01)
*H01S 5/183* (2006.01)
(Continued)

(52) U.S. Cl.
CPC ............ *G01S 7/4815* (2013.01); *F21V 5/041* (2013.01); *F21V 5/045* (2013.01); *G01J 1/44* (2013.01);
(Continued)

(58) Field of Classification Search
CPC ............ H01S 5/18397; H01S 5/04254; H01S 5/18394; H01S 5/02288; H01S 5/4025;
(Continued)

(56) References Cited

U.S. PATENT DOCUMENTS 5,581,094 A * 12/1996 Hara ................... G01S 7/483
250/206.1
5,909,296 A 6/1999 Tsacoyeanes
(Continued)

FOREIGN PATENT DOCUMENTS

CN 1650489 8/2005
CN 106505410 3/2017
(Continued)

OTHER PUBLICATIONS

Kang et al. "Compliant, Heterogeneously Integrated GaAs Micro-VCSELS towards Wearable and Implantable Integrated Optoelectronics Platforms" Advanced Optical Materials (33 pages) (2014).
(Continued)

*Primary Examiner* — Jennifer D Bennett
(74) *Attorney, Agent, or Firm* — Myers Bigel, P.A.

(57) ABSTRACT

A semiconductor device includes a detector structure. The detector structure includes an integrated circuit on a substrate, and a photo detector on an upper surface of the integrated circuit that is opposite the substrate, where the substrate is non-native to the photo detector. A System-on-Chip apparatus includes at least one laser emitter on a non-native substrate, at least one photo detector on the non-native substrate, and an input/output circuit. The at least one photo detector of the second plurality of photo detectors is disposed on an integrated circuit between the at least one photo detector and the non-native substrate to form a detector structure.

20 Claims, 26 Drawing Sheets

(51) Int. Cl.

| | |
|---|---|
| *H01S 5/30* | (2006.01) |
| *H01S 5/00* | (2006.01) |
| *H01S 5/026* | (2006.01) |
| *G01S 17/02* | (2020.01) |
| *G01S 17/89* | (2020.01) |
| *F21V 5/04* | (2006.01) |
| *H01S 5/40* | (2006.01) |
| *G02B 26/10* | (2006.01) |
| *H01S 5/062* | (2006.01) |
| *H01S 5/42* | (2006.01) |
| *G01J 1/44* | (2006.01) |
| *H01L 31/167* | (2006.01) |
| *H01L 31/18* | (2006.01) |
| *G02B 5/08* | (2006.01) |
| *H01L 25/00* | (2006.01) |
| *H01S 3/02* | (2006.01) |
| *G02B 3/00* | (2006.01) |
| *H01S 5/12* | (2021.01) |
| *H01S 5/02* | (2006.01) |

(52) U.S. Cl.
CPC .............. *G01S 17/02* (2013.01); *G01S 17/89* (2013.01); *G02B 5/0883* (2013.01); *G02B 26/10* (2013.01); *H01L 25/50* (2013.01); *H01L 31/167* (2013.01); *H01L 31/18* (2013.01); *H01S 3/025* (2013.01); *H01S 5/0028* (2013.01); *H01S 5/0071* (2013.01); *H01S 5/026* (2013.01); *H01S 5/0262* (2013.01); *H01S 5/062* (2013.01); *H01S 5/183* (2013.01); *H01S 5/18394* (2013.01); *H01S 5/18397* (2013.01); *H01S 5/30* (2013.01); *H01S 5/40* (2013.01); *H01S 5/4025* (2013.01); *H01S 5/4037* (2013.01); *H01S 5/4075* (2013.01); *H01S 5/423* (2013.01); *G01J 2001/448* (2013.01); *G02B 3/0006* (2013.01); *H01S 5/0216* (2013.01); *H01S 5/0217* (2013.01); *H01S 5/12* (2013.01)

(58) Field of Classification Search
CPC ........ H01S 5/423; H01S 5/0262; H01S 5/026; H01S 5/40; H01S 5/0217; H01S 5/04257; H01S 5/30; H01S 5/0028; H01S 5/0071; H01S 3/025; H01S 5/062; H01S 5/4075; H01S 5/4037; H01S 5/183; H01S 5/12; H01S 5/0216; G02B 5/0883; G02B 26/10; G02B 3/0006; F21V 5/045; F21V 5/041; G01S 17/89; G01S 17/02; G01S 7/4815; G01J 1/44; G01J 2001/448; H01L 31/167; H01L 31/18; H01L 25/50
See application file for complete search history.

(56) References Cited

U.S. PATENT DOCUMENTS

| | | | |
|---|---|---|---|
| 6,246,708 B1 | 6/2001 | Thornton | |
| 6,262,540 B1 | 7/2001 | Seko | |
| 6,603,867 B1* | 8/2003 | Sugino | .............. G06K 9/00201 340/5.82 |
| 7,544,945 B2 | 6/2009 | Tan et al. | |
| 8,648,310 B2* | 2/2014 | Mollov | ................ G01T 1/2006 250/366 |
| 8,761,594 B1 | 6/2014 | Gross et al. | |
| 9,065,239 B2 | 6/2015 | Joseph et al. | |
| 9,126,034 B1 | 9/2015 | Deroberts | |
| 9,484,495 B2 | 11/2016 | Padullaparthi | |
| 2003/0185268 A1 | 10/2003 | Zhang | |
| 2004/0036074 A1 | 2/2004 | Kondo | |
| 2005/0094695 A1 | 5/2005 | Trezza | |
| 2006/0104328 A1 | 5/2006 | Crews | |
| 2007/0181810 A1 | 8/2007 | Tan et al. | |
| 2007/0221858 A1* | 9/2007 | Abenaim | .............. G01T 1/2018 250/370.11 |
| 2008/0317200 A1* | 12/2008 | Lecomte | ................ A61B 6/032 378/19 |
| 2010/0045963 A1* | 2/2010 | Yamaguchi | .......... G01B 11/026 356/4.01 |
| 2010/0195689 A1 | 8/2010 | Ariga et al. | |
| 2011/0019205 A1* | 1/2011 | Gerber | .............. G06K 9/00355 356/615 |
| 2011/0248151 A1* | 10/2011 | Holcombe | ................ G01J 1/44 250/221 |
| 2012/0033692 A1 | 2/2012 | Schleuning | |
| 2012/0294416 A1* | 11/2012 | Ashokan | ........... H01L 27/14627 378/19 |
| 2013/0026350 A1* | 1/2013 | Yao | .......... G01V 8/20 250/221 |
| 2013/0153277 A1* | 6/2013 | Menard | .................. H01L 24/29 174/260 |
| 2014/0071431 A1 | 3/2014 | Last | |
| 2014/0210793 A1* | 7/2014 | Eriksson | ................ F24C 7/083 345/175 |
| 2014/0218898 A1 | 8/2014 | Seurin et al. | |
| 2014/0270073 A1* | 9/2014 | Spahn | .................... A61B 6/482 378/62 |
| 2015/0131080 A1 | 5/2015 | Retterath et al. | |
| 2015/0219764 A1 | 8/2015 | Lipson | |
| 2015/0260830 A1 | 9/2015 | Ghosh et al. | |
| 2015/0323379 A1 | 11/2015 | Wu | |
| 2016/0141839 A1 | 5/2016 | Matsubara | |
| 2016/0282468 A1 | 9/2016 | Gruver et al. | |
| 2017/0063035 A1 | 3/2017 | Wang et al. | |
| 2017/0069609 A1 | 3/2017 | Zhang et al. | |
| 2017/0070027 A1 | 3/2017 | Kondo et al. | |
| 2017/0122801 A1* | 5/2017 | Costello | .................... G01J 1/46 |

FOREIGN PATENT DOCUMENTS

| | | |
|---|---|---|
| JP | 2003522421 | 7/2003 |
| JP | 2005158922 | 6/2005 |
| JP | 4086254 | 5/2008 |
| KR | 1020030038072 | 5/2003 |
| KR | 1020120131821 | 12/2012 |
| WO | 2011011291 | 1/2011 |

OTHER PUBLICATIONS

Kim et al. "GaN microcavity structure with dielectric distributed Bragg reflectors fabricated by using a wet-chemical etching of a (111) Si substrate" Applied Physics Letters 89(4):041129 (2006).

Liu, Yue "Heterogeneous Integration of OE Arrays With Si Electronics and Microoptics" IEEE Transactions on Advanced Packaging 25(1):43-49 (2002).

Muller et al. "1550-nm High-Speed Short-Cavity VCSELs" IEEE Journal of Selected Topics in Quantum Electronics 17(5):1158-1166 (2011).

International Search Report and Written Opinion dated Aug. 8, 2018 for corresponding International Application No. PCT/US2018/027288 (13 pages).

International Search Report and Written Opinion dated Aug. 8, 2018 for corresponding International Application No. PCT/US2018/027298 (14 pages).

International Search Report and Written Opinion dated Jul. 30, 2018 for corresponding International Application No. PCT/US2018/027333 (16 pages).

First Office Action issued in corresponding Chinese Application No. 201880034133.7, dated Oct. 30, 2020 (including English translation).

Extended European Search Report dated Jan. 19, 2021, corresponding to related European Application No. 18785021.9.

Sjölund et al., "Monolithic Integration of substrate Input/Output Resonant Photodetectors and Vertical-Cavity Lasers", Journal of Quantum Electronics, vol. 35, No. 7, Jul. 1999.

(56) References Cited

OTHER PUBLICATIONS

European Search Report dated Dec. 23, 2020, corresponding to related European Application No. 18783963.4.

* cited by examiner

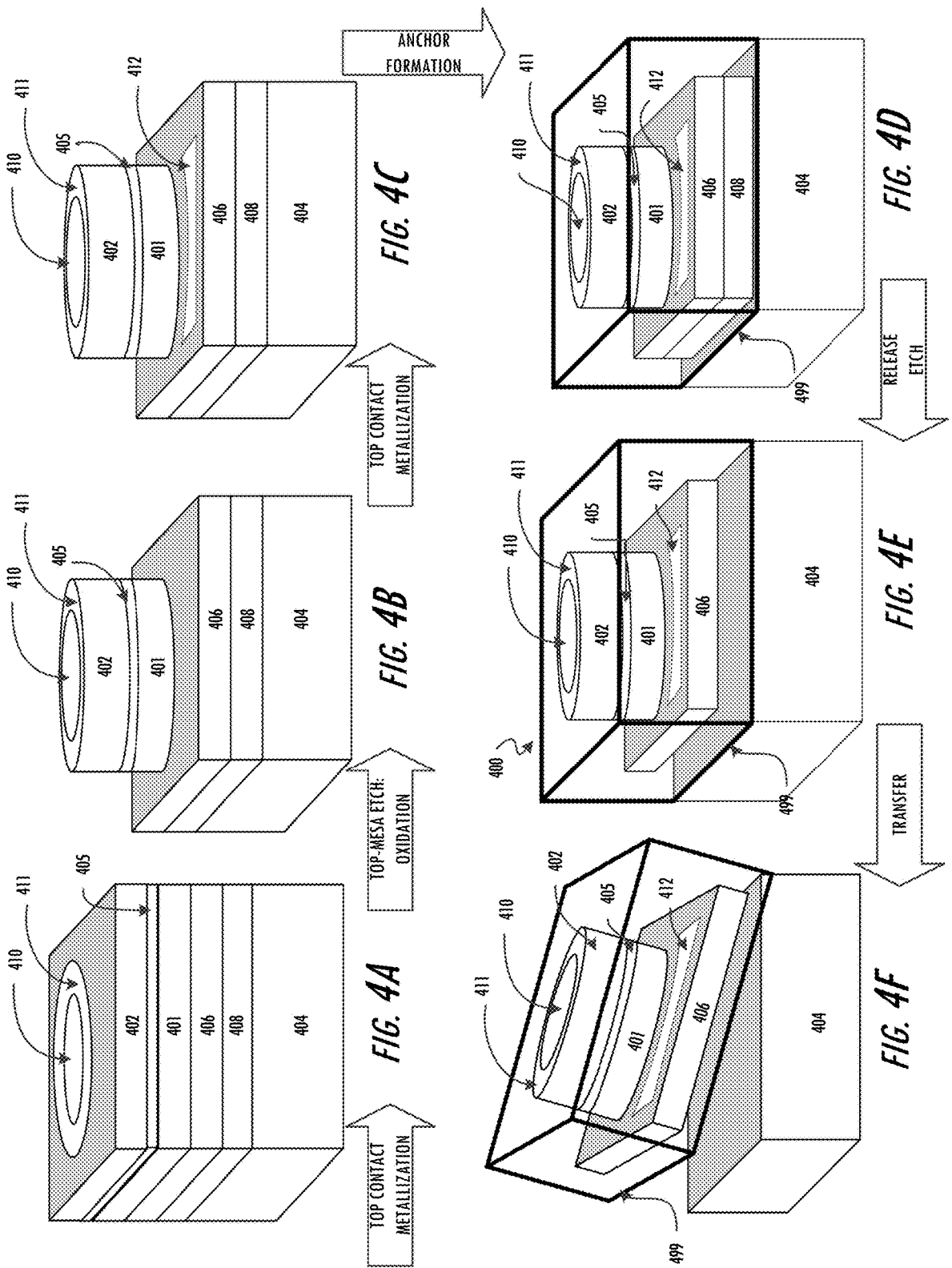

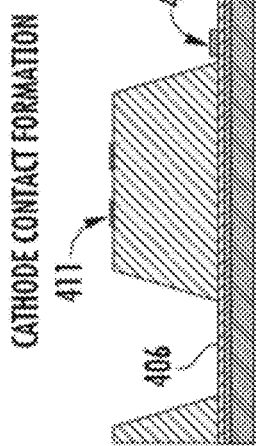
FIG. 4A'
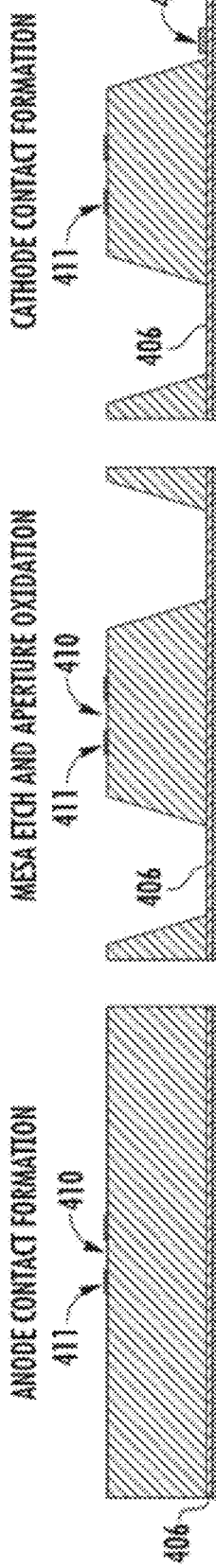
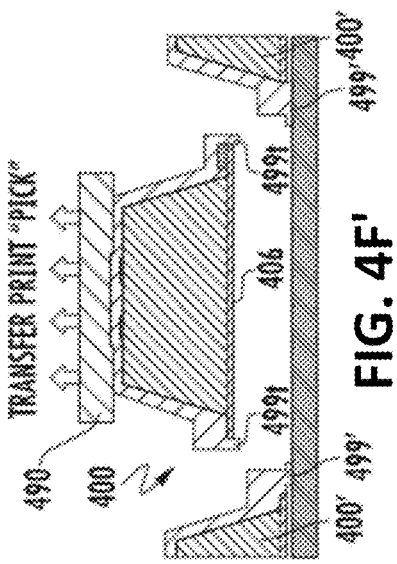
FIG. 4C'
FIG. 4B'
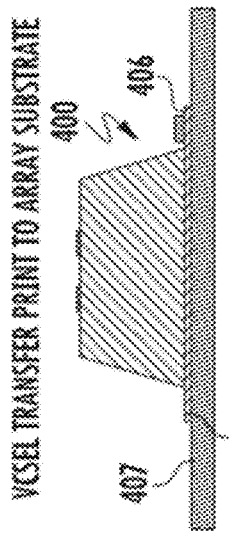
FIG. 4F'
FIG. 4E'
FIG. 4D'
FIG. 4G'

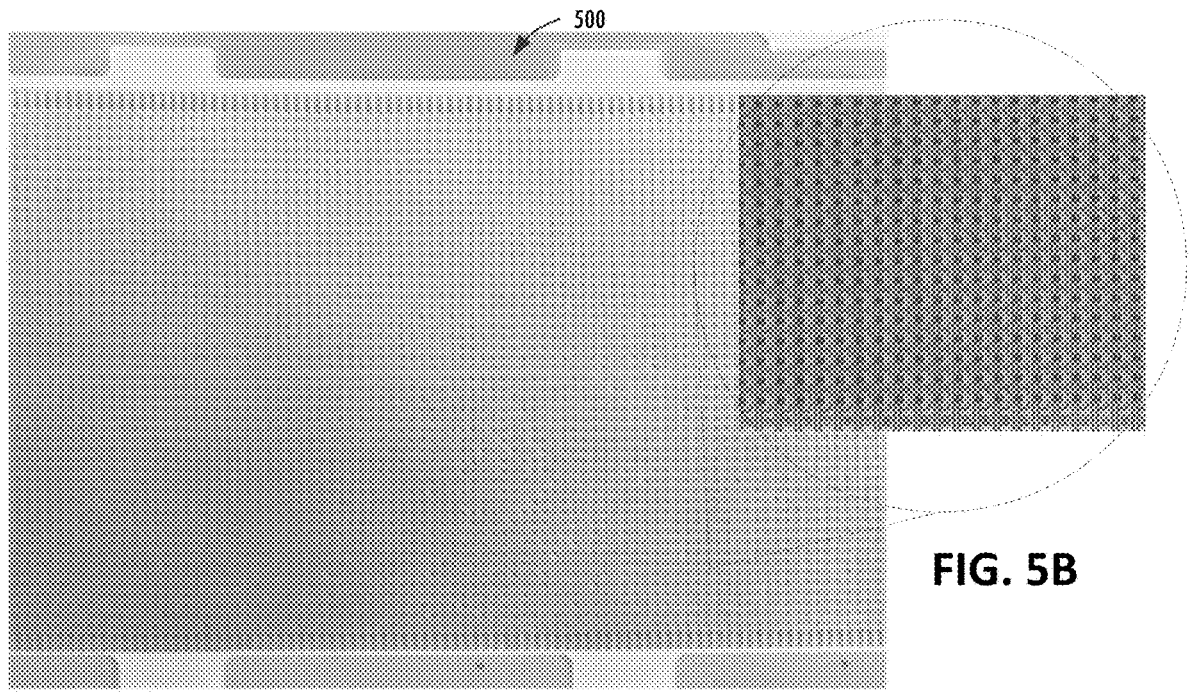
FIG. 5B
FIG. 5A
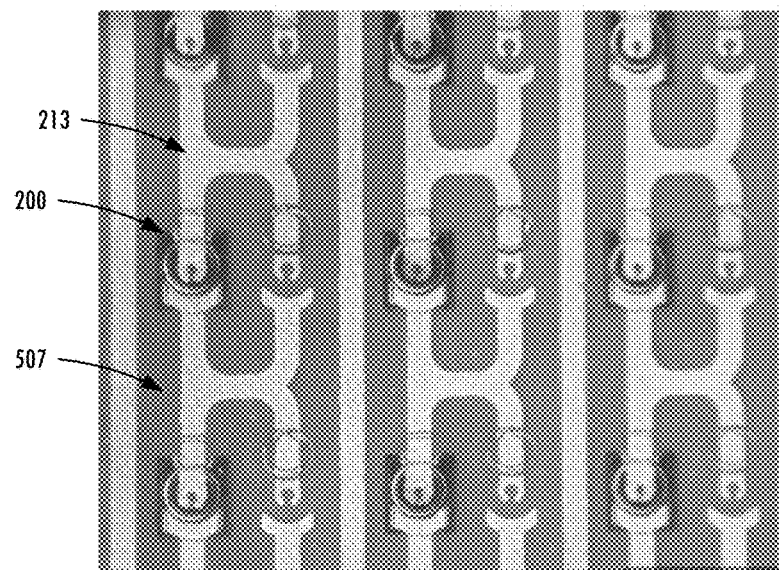
FIG. 5C

DEVICES INCORPORATING INTEGRATED DETECTORS AND ULTRA-SMALL VERTICAL CAVITY SURFACE EMITTING LASER EMITTERS

CLAIM OF PRIORITY

This application claims priority from U.S. Provisional Patent Application No. 62/484,701 entitled "LIGHT DETECTION AND RANGING (LIDAR) DEVICES AND METHODS OF FABRICATING THE SAME" filed Apr. 12, 2017, and U.S. Provisional Patent Application No. 62/613,985 entitled "ULTRA-SMALL VERTICAL CAVITY SURFACE EMITTING LASER (VCSEL) AND ARRAYS INCORPORATING THE SAME" filed Jan. 5, 2018, with the United States Patent and Trademark Office, the disclosures of which are incorporated by reference herein.

FIELD

The present invention relates to semiconductor-based lasers and related devices and methods of operation.

BACKGROUND

Many emerging technologies, such as Internet-of-Things (IoT) and autonomous navigation, may involve detection and measurement of distance to objects in three-dimensional (3D) space. For example, automobiles that are capable of autonomous driving may require 3D detection and recognition for basic operation, as well as to meet safety requirements. 3D detection and recognition may also be needed for indoor navigation, for example, by industrial or household robots or toys.

Light based 3D measurements may be superior to radar (low angular accuracy, bulky) or ultra-sound (very low accuracy) in some instances. For example, a light-based 3D sensor system may include a detector (such as a photodiode or camera) and a light emitting device (such as a light emitting diode (LED) or laser diode) as light source, which typically emits light outside of the visible wavelength range. A vertical cavity surface emitting laser (VCSEL) is one type of light emitting device that may be used in light-based sensors for measurement of distance and velocity in 3D space.

SUMMARY

Some embodiments described herein are directed to a laser diode, such as a VCSEL or other surface-emitting laser diode, an edge-emitting laser diode, and/or other semiconductor laser, and arrays incorporating the same.

According to some embodiments, a semiconductor device includes a detector structure. The detector structure includes an integrated circuit on a substrate, and a photo detector on an upper surface of the integrated circuit that is opposite the substrate, where the substrate is non-native to the photo detector.

In some embodiments, a ratio of a first area of the photo detector to a second area of the detector structure is greater than 80%.

In some embodiments, the semiconductor device further includes a plurality of laser emitters on the substrate. The substrate is non-native to the plurality of laser emitters and a spacing between adjacent ones of the laser emitters is less than 500 μm.

In some embodiments, the plurality of laser emitters and the detector structure are disposed on opposite sides of the substrate.

In some embodiments, the plurality of laser emitters are configured to emit light through the substrate.

In some embodiments, the photo detector comprises a plurality of photo detectors, and a spacing between adjacent photo detectors of the plurality of photo detectors is less than 20 μm.

In some embodiments, the plurality of photo detectors comprises a first array of photo detectors having a first density and a second array of photo detectors having a second density, different from the first density.

In some embodiments, the photo detector comprises a broken tether portion and/or a relief feature at a periphery thereof.

In some embodiments, the semiconductor device further includes a lenslet on the photo detector.

According to some embodiments, a method of fabricating a semiconductor device includes disposing a detector structure on a substrate, where the detector structure includes an integrated circuit on a substrate, and a photo detector on a surface of the integrated circuit that is opposite the substrate. The substrate is non-native to the photo detector.

In some embodiments of the method, a ratio of a first area of the photo detector to a second area of the detector structure is greater than 80%.

In some embodiments of the method, the photo detector is disposed on the upper surface of the integrated circuit using a micro-transfer printing process.

In some embodiments of the method, the micro-transfer printing process results in the formation of a broken tether portion and/or a relief feature at a periphery of the of photo detector.

In some embodiments, the method further includes disposing a plurality of laser emitters on the substrate using the micro-transfer printing process, wherein the substrate is non-native to the plurality of laser emitters.

In some embodiments of the method, the micro-transfer printing process results in a formation of a broken tether portion and/or a relief feature at a periphery of at least one of the plurality of laser emitters.

In some embodiments of the method, the plurality of laser emitters and the detector structure are disposed on opposite sides of the substrate.

According to some embodiments, a System-on-Chip apparatus includes at least one laser emitter on a non-native substrate, at least one photo detector on the non-native substrate, and an input/output circuit. The at least one photo detector is disposed on an integrated circuit between the at least one photo detector and the non-native substrate to form a detector structure.

In some embodiments, a ratio of a first area of the at least one photo detector to a second area of the detector structure is greater than 80%.

In some embodiments, the System-on-Chip apparatus further includes a timing control processor coupled to the at least one laser emitter, the at least one photo detector, and the input/output circuit.

In some embodiments, a surface of the non-native substrate having the at least one laser emitter and the at least one photo detector thereon has a width and/or a length of less than 2 millimeters.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 4A-4F are perspective views illustrating an example fabrication process for laser diodes in accordance with some embodiments described herein.

FIGS. 4A'-4G' are cross-sectional views illustrating an example fabrication process for laser diodes in accordance with some embodiments described herein.

FIGS. 5A-5C are images of VCSEL arrays assembled in accordance with some embodiments described herein.

DETAILED DESCRIPTION

Figure 1:
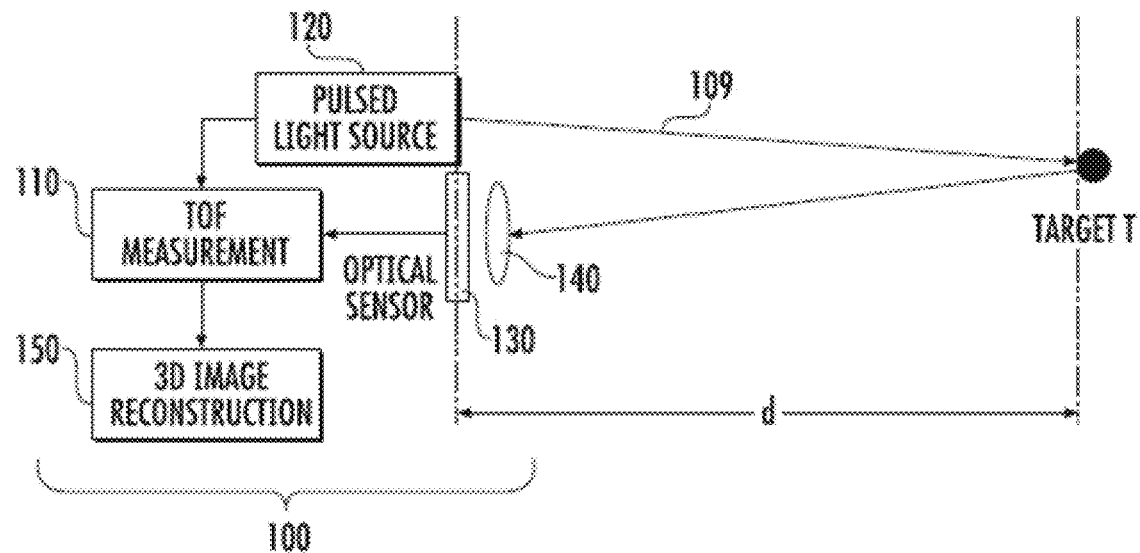
FIG. 1 is a diagram illustrating an example light-based 3D sensor system in accordance with some embodiments described herein.

Embodiments described herein may arise from realization that more compact arrays of light emitters may be advantageous in emerging technologies. For example, as shown in FIG. 1, a light-based 3D sensor system 100, such as a Light Detection and Ranging (LIDAR) system, may use time-of-flight (TOF)-based measurement circuit 110 and a 3D image reconstruction circuit 150 based on a signal received from an optical detector circuit 130 and associated optics 140, with a pulsed light emitting device array 120 as a light source. The time-of-flight measurement circuit 110 may determine the distance d to target T by measuring the round trip ("time-of-flight"; ToF) of a laser pulse 109 reflected by the target T (where d=(speed of light (c)/2)×ToF), which may be used by the 3D image reconstruction circuit 150 to create an accurate 3D map of surroundings. Some advantages of LIDAR systems may include long range; high accuracy; superior object detection and recognition; higher resolution; higher sampling density of 3D point cloud; and effectivity in diverse lighting and/or weather conditions. Applications of LIDAR systems may include ADAS (Advanced Driver Assistance Systems), autonomous vehicles, UAVs (unmanned aerial vehicles), industrial automation, robotics, biometrics, modeling, augmented and virtual reality, 3D mapping, and security. The example of FIG. 1 illustrates a flash LIDAR system, where the pulsed light emitting device array 120 emits light for short durations over a relatively large area to acquire images, in contrast with some traditional scanning LIDAR techniques (which generate image frames by raster scanning). However, it will be understood that light emitting device arrays 120 described herein can be used for implementations of scanning LIDAR as well.

Still referring to FIG. 1, the light emitting device array 120 may include a plurality of electrically connected surface-emitting laser diodes, such as VCSELs, and may be operated with strong single pulses at low duty cycle or with pulse trains, typically at wavelengths outside of the visible spectrum. Because of sensitivity to background light and the decrease of the signal with distance, several watts of laser power may be used to detect a target T at a distance d of up to about 100 meters or more.

However, some conventional VCSELs may have sizes defined by dimensions (e.g., length, width, and/or diameter) of about 150 micrometers (μm) to about 200 μm, which may impose size and/or density constraints on sensor systems including an array of discrete VCSELs. This relatively large VCSEL size may be dictated for use with conventional pick-and-place machines, as well as for sufficient contact surface area for wire bond pads to provide electrical connections to the VCSEL. For example, some conventional solder ball or wire bond technology may require more than about 30 μm in length for the bond pad alone, while the tip used to pull the wire bond may have an accuracy on the order of tens of micrometers.

Some embodiments described herein provide light emitting devices, such as surface-emitting laser diodes (e.g., VCSELs), having reduced dimensions (e.g., lengths and/or widths of about 30 micrometers (μm) or less) without affecting the device performance (e.g., power output). For example, the aperture of the VCSEL die (which is the active region where the lasing takes place) may be about 10 μm to about 20 μm in diameter. The die length can be reduced to the aperture diameter plus a few microns by reducing or eliminating wasted (non-active) area, and by retaining a few microns (e.g., about 4 μm to about 6 μm or less) of combined chip length for the anode and the cathode contacts. This may provide a reduction in dimensions (e.g., length and/or width) by a factor of about 10 or more (e.g., die lengths of about 15 micrometers (μm) to about 20 μm, as compared to some conventional VCELs with die lengths of about 150 μm to about 200 μm). In some embodiments, these reduced die dimensions may allow for fabrication of emitter arrays including a greater density (e.g., thousands) of VCSELs or other laser diodes.

Figure 2A:
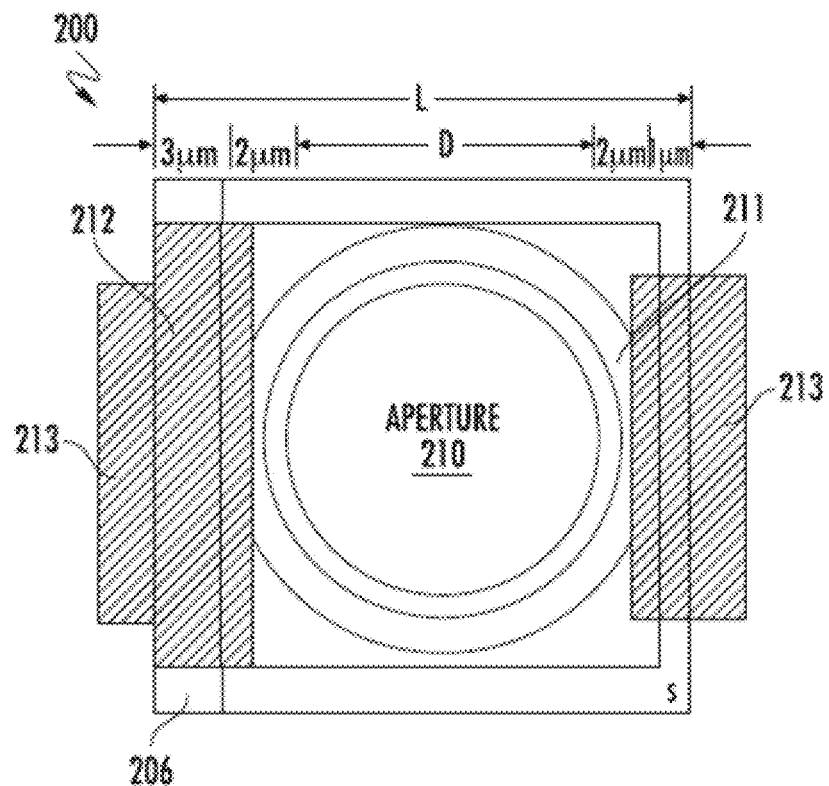
FIG. 2A is a plan view illustrating an example laser diode with reduced anode and cathode contact dimensions in accordance with some embodiments described herein.
Figure 2B:
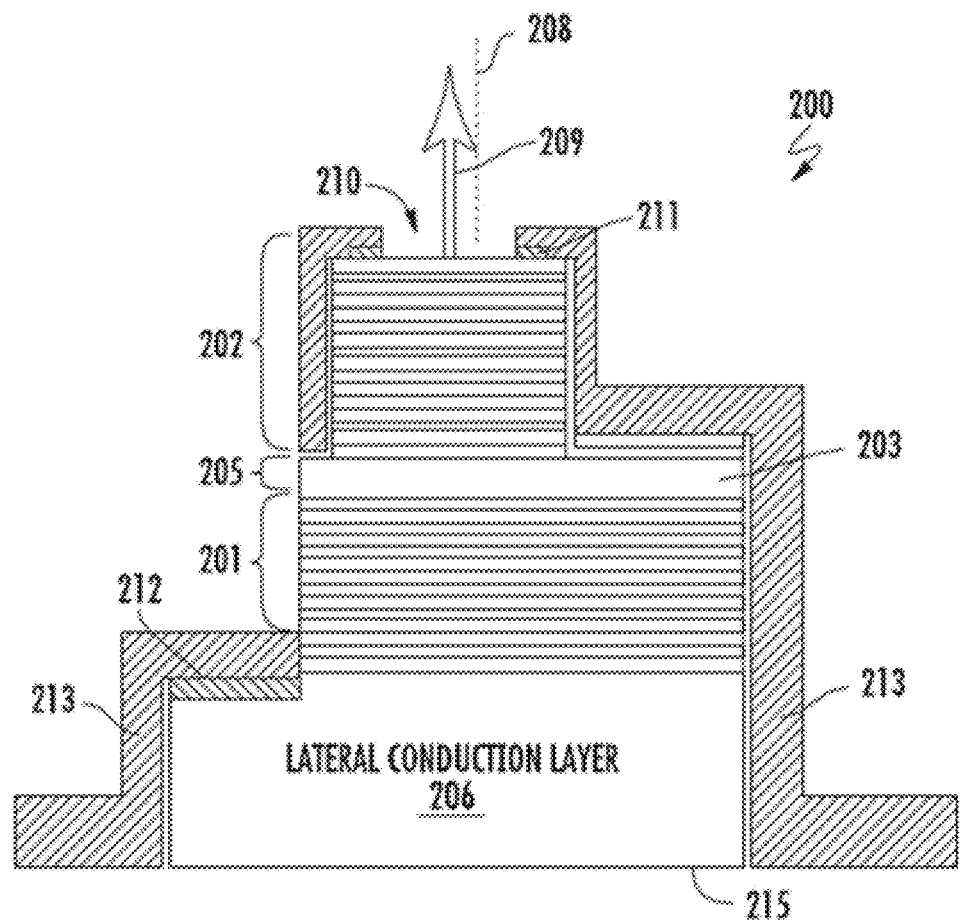
FIG. 2B is a cross-sectional view of the laser diode of FIG. 2A.

FIGS. 2A and 2B are plan and cross-sectional views illustrating an example surface-emitting light emitting device (shown as a vertical cavity surface emitting laser diode (VCSEL) chip or die 200, also referred to herein as a VCSEL 200) in accordance with some embodiments described herein, which includes anode and cathode contacts 211, 212 that are smaller than the lasing aperture 210 in at least one dimension. As shown in FIGS. 2A and 2B, the VCSEL 200 includes an active region 205 with one or more quantum wells 203 for generation and emission of coherent light 209. The optical cavity axis 208 of the VCSEL 200 is oriented along the direction of current flow (rather than perpendicular to the current flow as in some conventional laser diodes), defining a vertical cavity with a length along the direction of current flow. This cavity length of the active region 205 may be short compared with the lateral dimensions of the active region 205, so that the radiation 209 emerges from the surface of the cavity rather than from its edge.

The active region 205 may be sandwiched between distributed Bragg reflector (DBR) mirror layers (also referred to herein as Bragg reflector layers or Bragg mirrors) 201 and 202 provided on a lateral conduction layer (LCL) 206. The LCL 206 may allow for improved electrical and/or optical characteristics (as compared to direct contact to the reflector layer 401) in some embodiments. In some embodiments, a surface of the LCL layer 206 may provide a print interface 215 including an adhesive layer that improves adhesion with an underlying layer or substrate. The adhesive layer may be optically transparent to one or more wavelength ranges and/or can be refractive-index matched to provide desired optical performance. The reflector layers 201 and 202 at the ends of the cavity may be made from alternating high and low refractive index layers. For example, the reflector layers 201 and 202 may include alternating layers having thicknesses d1 and d2 with refractive indices n1 and n2 such that $n1 d1 + n2 d2 = \lambda/2$, to provide wavelength-selective reflectance at the emission wavelength $\lambda$. This vertical construction may increase compatibility with semiconductor manufacturing equipment. For example, as VCSELs emit light 209 perpendicular to the active region 205, tens of thousands of VCSELs can be processed simultaneously, e.g., by using standard semiconductor wafer processing steps to define the emission area and electrical terminals of the individual VCSELs from a single wafer.

Figure 9:
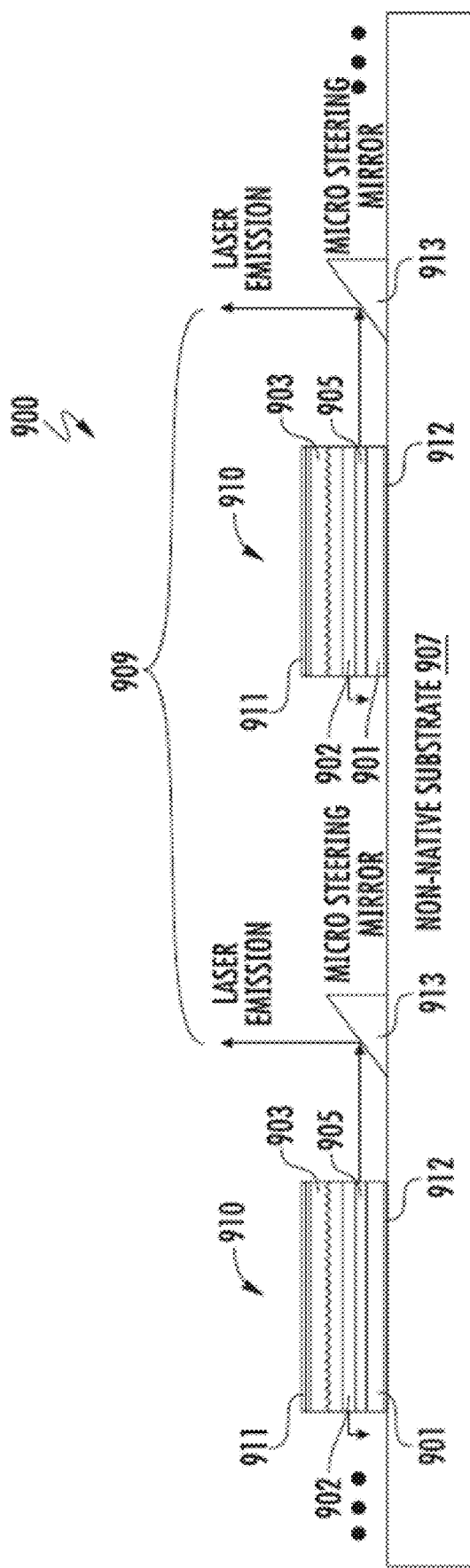
FIG. 9 is a cross-sectional view illustrating an example laser diode array in accordance with further embodiments described herein.

Although described herein primarily with reference to VCSEL structures, it will be understood that embodiments described herein are not limited to VCSELs, and the laser diode 200 may include other types of laser diodes that are configured to emit light 209 along an optical axis 208 that is oriented perpendicular to a substrate or other surface on which the device 200 is provided. It will also be understood that, while described herein primarily with reference to surface-emitting laser structures, laser diodes and laser diode arrays as described herein are not so limited, and may include edge-emitting laser structures that are configured to emit light along an optical axis that is oriented parallel to a substrate or other surface on which the device is provided as well, as shown in the example of FIG. 9.

The VCSEL 200 may be formed of materials that are selected to provide light emission at or over a desired wavelength range, which may be outside of the spectrum of light that is visible to the human eye. For example, the VCSEL 200 may be a gallium arsenide (GaAs)-based structure in some embodiments. In particular embodiments, the active region 205 may include one or more GaAs-based layers (for example, alternating InGaAs/GaAs quantum well and barrier layers), and the Bragg mirrors 201 and 202 may include GaAs and aluminum gallium arsenide ($Al_xGa_{(1-x)}As$). For instance, the lower Bragg mirror 201 may be an n-type structure including alternating layers of n-AlAs/GaAs, while the upper Bragg mirror 202 may be a p-type structure including alternating layers of p-AlGaAs/GaAs. Although described by way of example with reference to a GaAs-based VCSEL, it will be understood that materials and/or material compositions of the layers 201, 202, and/or 205 may be tuned and/or otherwise selected to provide light emission at desired wavelengths, for example, using shorter wavelength (e.g., GaN-based) and/or longer wavelength (e.g., InP-based) emitting materials.

In the example of FIGS. 2A and 2B, the VCSEL 200 includes a lasing aperture 210 having a dimension (illustrated as diameter D) of about 12 μm, and first and second electrically conductive contact terminals (illustrated as anode contact 211 and cathode contact 212, also referred to herein as first and second contacts). A first electrically conductive film interconnect 213 is provided on the first contact 211, and a second electrically conductive film interconnect 213 is provided on the second contact 212 to provide electrical connections to the VCSEL 200. FIG. 2B more clearly illustrates the anode contact 211 and cathode contact 212 in cross section, with the conductive film interconnects 213 thereon. The first and second contacts 211 and 212 may provide contacts to semiconductor regions of opposite conductivity type (P-type and N-type, respectively). Accordingly, embodiments described herein are configured for transfer of electric energy to the VCSEL contacts 211 and 212 through thin-film interconnects 213, which may be formed by patterning an electrically conductive film, rather than incorporating wire bonds, ribbons, cables, or leads. The interconnections 213 may be formed after providing the VCSEL 200 on a target substrate (e.g., a non-native substrate that is different from a source substrate on which the VCSEL 200 is formed), for example, using conventional photolithography techniques, and may be constructed to have low resistance. In this regard, materials for the electrically conductive film interconnects 213 may include aluminum or aluminum alloys, gold, copper, or other metals formed to a thickness of approximately 200 nm to approximately 500 nm.

As shown in FIG. 2A, the first and second conductive contacts 211 and 212 are smaller than the aperture 210 in one or more dimensions. In some embodiments, allowing about 2 μm to about 3 μm for the dimensions of each of the contacts 211, 212, the overall dimensions of the VCSEL die 200 can be significantly reduced. For example, for anode and cathode contacts that are 2 μm in length each, a dimension L can be reduced to about 16 μm (2 μm anode length+12 μm aperture+2 μm cathode length; all measured along dimension L) providing a 16×16 μm² die. As another example, for anode and cathode contacts that are 3 μm in length each, a dimension L can be reduced to about 18 μm (3 μm anode+12 μm aperture+3 μm cathode) providing an 18×18 μm² die. Die dimensions L may be further reduced or slightly increased for smaller aperture dimensions D (e.g., 10 μm) or larger aperture dimensions D (e.g., 20 μm). More generally, VCSEL dies 200 according to some embodiments herein may achieve a contact area-to-aperture area ratio of about 0.05 to 30, about 0.1 to 20, about 1 to 10, or about 1 to 3, where the contact area refers to the surface area of electrical contacts 211 and/or 212 positioned on or adjacent the aperture 210 on the surface S. Also, although illustrated with reference to contacts 211, 212 and interconnections 213 at particular locations relative to the aperture 210, it will be understood that embodiments described herein are not so limited, and the contacts 211, 212 and interconnections 213 may be provided at other areas of the VCSEL die 200 (e.g., at corners, etc.).

VCSELs 200 in accordance with some embodiments described herein may be configured to emit light with greater than about 100 milliwatts (mW) of power within about a 1-10 nanosecond (ns) wide pulse width, which may be useful for LIDAR applications, among others. In some embodiments, more than 1 Watt peak power output with a 1 ns pulse width at a 10,000:1 duty cycle may be achieved from a single VCSEL element 200, due for instance to the reduced capacitance (and associated reduction in RLC time constants) as compared to some conventional VCSELs. VCSELs 200 as described herein may thus allow for longer laser lifetime (based upon low laser operating temperatures at high pulsed power), in combination with greater than about 200 meter (m) range (based on very high power emitter and increased detector sensitivity).

Figure 2C:
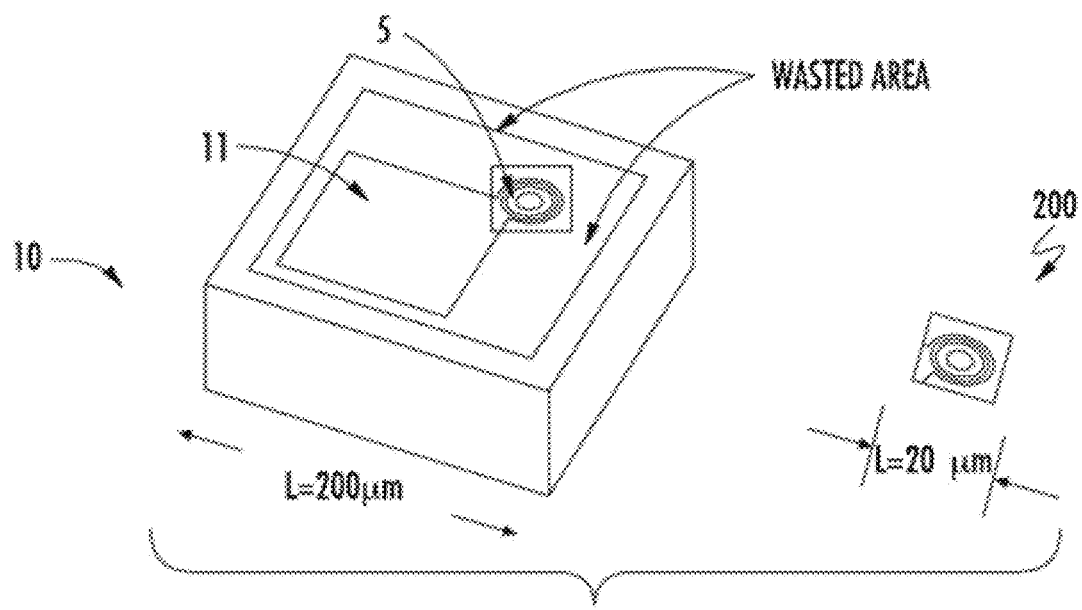
FIG. 2C is a perspective view illustrating an example laser diode in accordance with some embodiments described herein in comparison to a conventional VCSEL chip.

FIG. 2C is a plan view illustrating the VCSEL chip 200 in accordance with some embodiments described herein in comparison to a conventional VCSEL chip 10. As shown in FIG. 2C, the conventional VCSEL chip 10 may have a length L of about 200 μm, to provide sufficient area for the active region 5 and the top conductive wire bond pad 11, which may function as an n-type or p-type contact. In contrast, VCSEL chips 200 in accordance with some embodiments described herein may have a length L of about 20 μm or less. As electrical connections to the smaller contacts 211, 212 are provided by thin-film metallization interconnects 213, VCSEL chips 200 in accordance with some embodiments described herein require no bond pad, such that the optical aperture 210 occupies a majority of the overall surface area of the emitting surface S.

VCSEL chips 200 according to some embodiments of the present invention may thus have dimensions that are $1/100^{th}$ of those of some conventional VCSEL chips 10, allowing for up to one hundred times more power per area of the emitting surface S, as well as reduced capacitance which may substantially reduce the RLC time constants associated with driving fast pulses into these devices. Such an exponential reduction in size may allow for fabrication of VCSEL arrays including thousands of closely-spaced VCSELs 200, some of which are electrically connected in series (or anode-to-cathode) on a rigid or flexible substrate, which may not be possible for some conventional closely spaced VCSELs that are fabricated on a shared electrical substrate. For example, as described in greater detail below, multiple dies 200 in accordance with some embodiments described herein may be assembled and electrically connected within the footprint of the conventional VCSEL chip 10. In some applications, this size reduction and elimination of the bond pad may allow for reduction in cost (of up to one hundred times), device capacitance, and/or device thermal output, as compared to some conventional VCSEL arrays.

Figure 3A:
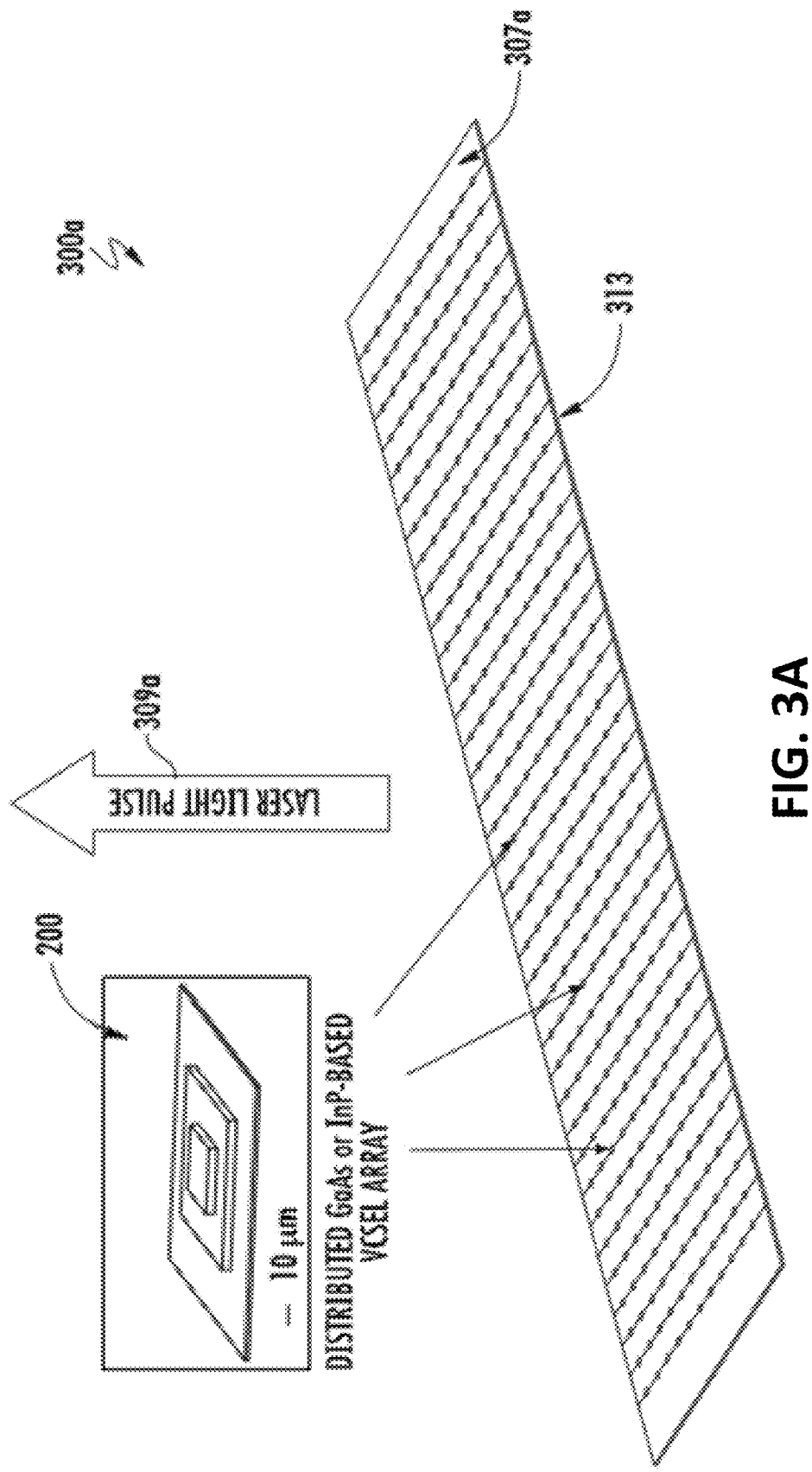
FIG. 3A is a perspective view illustrating a distributed emitter array including laser diodes in accordance with some embodiments described herein.

FIG. 3A is a perspective view illustrating a distributed emitter array 300a including laser diodes (illustrated as VCSELs 200) in accordance with some embodiments described herein. The array 300a (also referred to herein as a distributed VCSEL array (DVA)) may be assembled on a non-native substrate 307a, for example, by micro-transfer printing, electrostatic adhesion, or other mass transfer techniques. As used herein, a non-native substrate (also referred to herein as a target substrate) may refer to a substrate on which the laser diodes 200 are arranged or placed, which differs from a native substrate on which the laser diodes 200 are grown or otherwise formed (also referred to herein as a source substrate). The substrate 307a may be rigid in some embodiments, or may be flexible in other embodiments, and/or may be selected to provide improved thermal characteristics as compared to the source substrate. For example, in some embodiments the non-native substrate 307a may be thermally conducting and also electrically insulating (or coated with an insulating material, such as an oxide, nitride, polymer, etc.). Electrically conductive thin-film interconnects 313 may be formed to electrically connect respective contacts of the laser diodes 200 in series and/or parallel configurations, and may be similar to the interconnects 213 described above. This may allow for dynamically adjustable configurations, by controlling operation of subsets of the laser diodes 200 electrically connected by the conductive thin-film interconnects 313. In some embodiments, the array 300a may include wiring 313 between VCSELs 200 that are not connected in parallel (e.g., connections without a shared or common cathode/anode). That is, the electrically conductive thin-film interconnects 313 may provide numerous variations of series/parallel interconnections, as well as additional circuit elements which may confer good yield (e.g. bypass routes, fuses, etc.).

The conductive thin-film interconnects 313 may be formed in a parallel process, before and/or after providing the laser diodes 200 on the substrate 307a. For example, the conductive thin-film interconnects 313 may be formed by patterning an electrically conductive film on the substrate 307a using conventional photolithography techniques, such that the laser diodes 200 of the array 300 are free of electrical connections through the substrate 307a.

Due to the small dimensions of the laser diodes 200 and the connections provided by the conductive thin-film interconnects 313, a spacing or pitch between two immediately adjacent laser diodes 200 is less than about 500 micrometers (μm), or in some embodiments, less than about 200 μm, or less than about 150 μm, or less than about 100 μm, or less than about 50 μm, without connections to a shared or common cathode/anode. While some monolithic arrays may provide inter-laser diode spacings of less than about 100 μm, the laser diodes of such arrays may electrically share a cathode/anode and may mechanically share a rigid substrate in order to achieve such close spacings. In contrast, laser diode arrays as described herein (such as the array 300a) can achieve spacings of less than about 150 μm between immediately adjacent, serially-connected laser diodes 200 (that do not have a common anode or cathode connection), on non-native substrates (e.g., rigid or flexible substrates) in some embodiments. In addition, as described below with reference to the examples of FIGS. 6A-6C, some embodiments of the present disclosure may integrate other types of devices and/or devices formed from different materials (e.g. power capacitors, FETs, etc.) in-between laser diodes 200 at the sub-150 μm spacings described herein.

Also, in some embodiments, a concentration of the laser diodes 200 per area of the array 300a may differ at different portions of the array 300a. For example, some LIDAR sensor applications may benefit from higher resolution in a central portion of the array (corresponding to a forward direction of travel), but may not require such high resolution at peripheral regions of the array. As such, a concentration of VCSELs 200 at peripheral portions of the array 300a may be less than a concentration of VCSELs 200 at a central portion of the array 300a in some embodiments. This configuration may be of use in applications where the substrate is flexible and may be curved or bent in a desired shape, as shown in FIG. 3B.

Figure 3B:
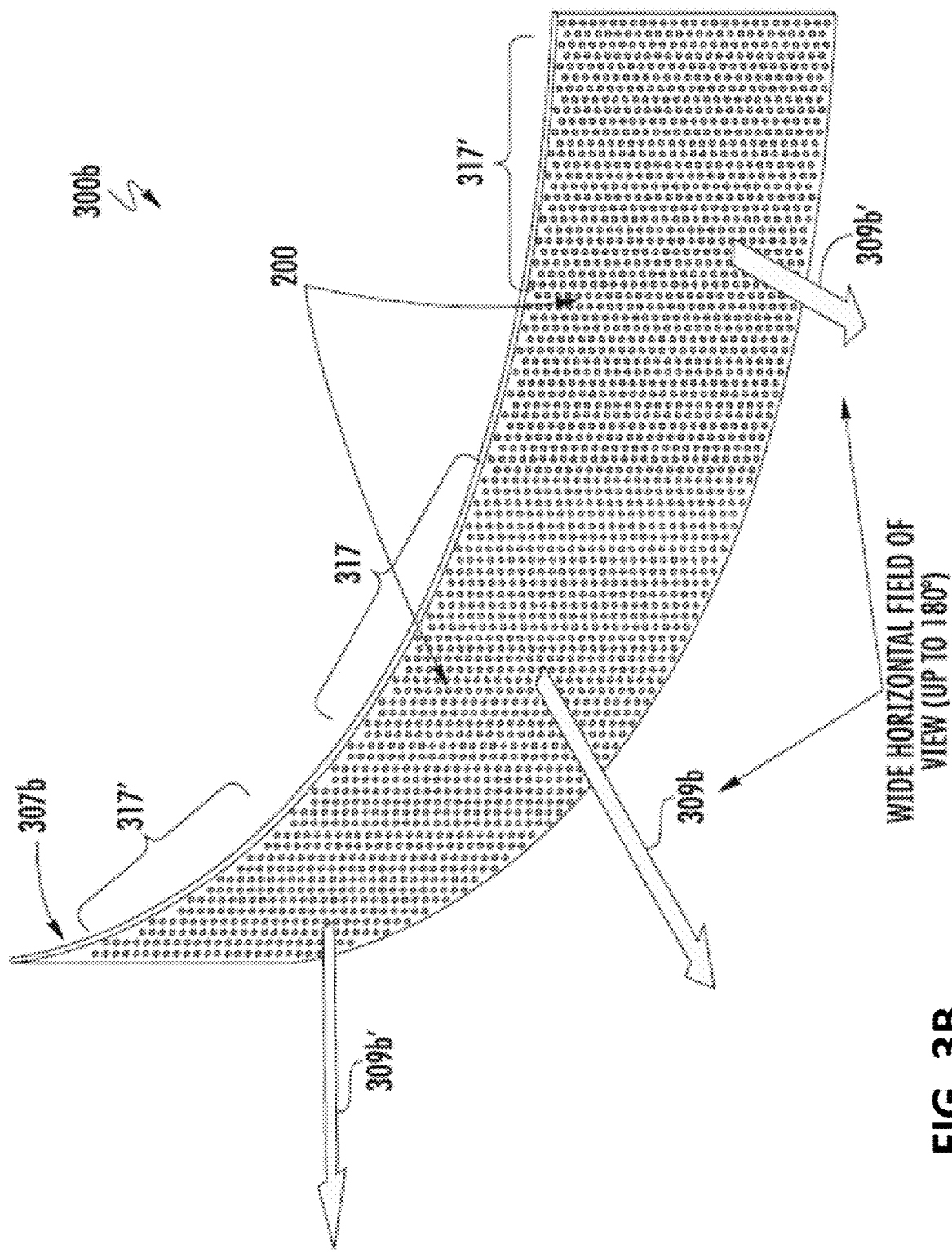
FIG. 3B is a perspective view illustrating a distributed emitter array including laser diodes on a curved substrate in accordance with some embodiments described herein.

FIG. 3B is a perspective view illustrating a distributed emitter array 300b including laser diodes 200 on a curved, non-native substrate 307b in accordance with some embodiments described herein. In some embodiments, the substrate 307b is formed of a flexible material that can be bent to provide curved emitting surface, such that VCSELs 200 mounted on a central portion 317 of the substrate 307b face a forward direction, while VCSELs 200 mounted on peripheral portions 317' of the substrate 307b face oblique directions. As the VCSELs 200 respectively emit light in a direction perpendicular to their active regions, the VCSELs 200 mounted on the central portion 317 emit light 309 in the forward direction, while the VCSELs 200 mounted on peripheral portions 317' of the substrate 307b emit light 309' in oblique directions, providing a wide field of view. In some embodiment, each VCSEL may provide narrow-field illumination (e.g., covering less than about 1 degree), and the arrays 300a, 300b may include hundreds or thousands of VCSELs 200 (e.g., an array of 1500 VCSELs, each covering a field of view of about 0.1 degree, can provide a 150 degree field of view).

The field of view can be tailored or changed as desired from 0 degrees up to about 180 degrees by altering the curvature of the substrate 307b. The curvature of the substrate 307b may or may not be constant radius, and can thereby be designed or otherwise selected to provide a desired power distribution. For example, the substrate 307b may define a cylindrical, acylindrical, spherical or aspherical curve whose normal surfaces provide a desired distribution of relative amounts of power. In some embodiments, the curvature of the substrate 307b may be dynamically altered by mechanical or electro-mechanical actuation. For example, a mandrel can be used to form the cylindrical or acylindrical shape of the flexible non-native substrate 307b. The mandrel can also serve as a heat sink in some embodiments. Also, as mentioned above, a spatial density or concentration of VCSELs 200 at peripheral portions of the array 300b may be less than a concentration of VCSELs 200 at a central portion of the array 300b in some embodiments. For example, rows or columns of the array 300b of VCSELs 200 may be arranged on the non-native substrate 307b at different and/or non-uniform pitches to provide a desired far-field output light pattern, for instance, using micro-transfer printing and/or other micro-assembly techniques.

The arrays 300a and 300b illustrated in FIGS. 3A and 3B may be scalable based on a desired quantity or resolution of laser diodes 200, allowing for long range and high pulsed power output (on the order of kilowatts (kW)). The spatial density or distribution of the laser diodes 200 on the surfaces of the substrates 307a and 307b can be selected to reduce optical power density, providing both long range and eye safety at a desired wavelength of operation (e.g., about 905 nm for GaAs VCSELs; about 1500 nm for InP VCSELs). A desired optical power density may be further achieved by controlling the duty cycle of the signals applied to the VCSELs and/or by altering the curvature of the substrate. Also, the separation or spacing between adjacent laser diodes 200 within the arrays 300a and 300b may be selected to provide thermal management and improve heat dissipation during operation, depending on the substrate material. For example, a spacing between two immediately adjacent laser diodes 200 of greater than about 100 μm micrometers (μm) may provide thermal benefits, especially for substrates with limited thermal conductivity. The arrays 300a and 300b as described herein may thereby provide greater reliability, by eliminating wire bonds, providing a fault-tolerant architecture, and/or providing lower operating temperatures. In further embodiments, self-aligning, low-cost beam forming micro-optics (e.g., ball lens arrays) may be integrated on or into the surface of the arrays 300a and 300b.

The compact arrays 300a and 300b shown in FIGS. 3A and 3B may be fabricated in some embodiments using micro-transfer printing (MTP), electrostatic adhesion, and/ or other massively parallel chip handling techniques that allow simultaneous assembly and heterogeneous integration of thousands of micro-scale devices on non-native substrates via epitaxial liftoff. For example, the arrays of VCSELs 200 can be fabricated using micro-transfer printing processes similar to those described, for example, in U.S. Pat. No. 7,972,875 to Rogers et al. entitled "Optical Systems Fabricated By Printing-Based Assembly," the disclosure of which is incorporated by reference herein in its entirety. The arrays of VCSELs 200 can alternatively be fabricated using electrostatic adhesion or gripping transfer techniques similar to those described, for example in U.S. Pat. No. 8,789,573 to Bibl et al. entitled "Micro device transfer head heater assembly and method of transferring a micro device," the disclosure of which is incorporated by reference herein in its entirety. In some embodiments, MTP, electrostatic adhesion, and/or other mass transfer techniques may allow for fabrication of VCSEL or other arrays of laser diodes with the small inter-device spacings described herein.

FIGS. 4A-4F are perspective views and FIGS. 4A'-4G' are cross-sectional views illustrating an example fabrication process for laser diodes (illustrated as VCSELs 400) in accordance with some embodiments described herein. The VCSELs 200 described herein may also be fabricated using one or more of the processing operations shown in FIGS.

4A-4F in some embodiments. As shown in FIGS. 4A-4F and FIGS. 4A'-4G', ultra small VCSELs 400 in accordance with embodiments described herein can be grown on source substrates and assembled on a non-native target substrate using micro-transfer printing techniques. In particular, in FIGS. 4A and 4A', sacrificial layer 408, a lateral conduction layer 406, a first, n-type distributed Bragg reflector (DBR) layer 401, an active region 405, and a second, p-type DBR layer 402 are sequentially formed on a source wafer or substrate 404. Although illustrated with reference to a single VCSEL 400 to show fabrication, it will be understood that a plurality of VCSELs 400 may be simultaneously fabricated on the source wafer 404, with reduced or minimal spacing between adjacent VCSELs 400 to increase or maximize the number of VCSELs that may be simultaneously fabricated on the wafer 404. Also, it will be understood that a plurality of VCSEL devices may be fabricated on a single die or chiplet that is released from the substrate 404 for printing. Also, the transfer techniques described in greater detail below may allow for reuse of the source wafer 404 for subsequent fabrication of additional VCSELs.

In some embodiments, the material compositions of the layers 406, 401, 405, and 402 may be selected to provide a desired emission wavelength and emission direction (optical axis). For example, the layers 406, 401, 405, and 402 may be gallium arsenide (GaAs)-based or indium phosphide (InP)-based in some embodiments. As illustrated, a lateral conduction layer 406, an AlGaAs n-type high-reflectivity distributed Bragg reflector (DBR), and an active region 405 are sequentially formed on the source wafer 404. The active region 405 may be formed to include InAlGaAs strained quantum wells designed to provide light emission over a desired wavelength, and is followed by formation of a p-type DBR output mirror 402. A top contact metallization process is performed to form a p-contact (e.g., an anode contact) 411 on the p-type DBR layer 402. For example, Ti/Pt/Au ring contacts of different dimensions may be deposited to form the anode or p-contact 411. An aperture 410 may be defined within a perimeter of the p-contact 411. In some embodiments, an oxide layer may be provided between the active region 405 and the p-type DBR layer 402 to define boundaries of the aperture 410. The placement and design of the aperture 410 may be selected to minimize optical losses and current spreading.

In FIGS. 4B and 4B', a top mesa etching process is performed to expose the active region 405 and a top surface of the n-type DBR layer 401, and an oxidation process is performed to oxidize the exposed surfaces, (including the exposed sidewalls of the active region 405), and in particular to laterally define boundaries of the optical aperture 410. In FIGS. 4C and 4C', a bottom contact metallization process is performed to expose and form an n-type (e.g., cathode) contact 412 on a surface of the lateral conduction layer 406. It will be understood that, in some embodiments, the n-type contact 412 may alternatively be formed on the n-type DBR layer 401 to provide the top-side contact. In FIGS. 4D and 4D', an isolation process is performed to define respective lateral conduction layers 406, and an anchor material (e.g., photoresist layer) is deposited and etched to define photoresist anchors 499 and inlets to expose sacrificial release layer 408 for epitaxial lift-off.

In FIGS. 4E and 4E', an undercut etching process is performed to remove portions of the sacrificial release layer 408 such that the anchors 499 suspend the VCSEL die 400 over the source wafer 404. In some embodiments, the operations of FIGS. 4E and 4E' may be followed by a micro-transfer printing process, as shown in FIGS. 4F and 4F', which may utilize an elastomeric and/or other stamp 490 to break the anchors 499, adhere the VCSEL die 400 (along with multiple other VCSEL dies 400 on the source wafer 404) to a surface of the stamp 490, and simultaneously transfer the multiple VCSEL dies 400 (which have been adhered to the surface of the stamp) to a non-native target substrate 407 by contacting the surface of the stamp including the dies 400 thereon with a surface of the non-native target substrate 407, as shown in FIG. 4G'. In other embodiments, the operations of FIG. 4F may be followed by an electrostatic gripper-based transfer process, which may utilize an electrostatic transfer head to adhere the VCSEL die 400 (along with multiple other VCSEL dies 400 on the source wafer 404) to a surface of the head using the attraction of opposite charges, and simultaneously transfer the VCSEL dies 400 to a non-native target substrate. As a result of breaking the anchors 499, each VCSEL die 400 may include a broken or fractured tether portion 499t (e.g., a residual portion of the anchor structure 499) protruding from or recessed within an edge or side surface of the die 400 (and/or a corresponding relief feature at a periphery of the die 400), which may remain upon transfer of the VCSEL dies 400 to the non-native substrate 407.

The non-native target substrate may be a rigid or flexible destination substrate for the VCSEL array, or may be a smaller interposer or "chiplet" substrate. Where the target substrate is the destination substrate for the array, an interconnection process may form a conductive thin film layer on the target substrate including the assembled VCSEL dies 400 thereon, and may pattern the conductive thin film layer to define thin-film metal interconnects that provide desired electrical connections between the VCSEL dies 400. The interconnection process may be performed after the VCSEL dies 400 are assembled on the destination substrate, or may be performed in a pre-patterning process on the destination substrate before the VCSEL dies 400 are assembled such that the electrical connections between the VCSEL dies 400 are realized upon assembly (with no interconnection processing required after the transfer of the dies 400 onto the substrate). Where the target substrate is a chiplet, the VCSEL dies 400 may be connected in parallel via the chiplet. The chiplets including the VCSEL dies 400 thereon may then be assembled (via transfer printing, electrostatic adhesion, or other transfer process) onto a destination substrate for the array, which may be pre- or post-patterned to provide electrical connections between the chiplets. The thin-film metal interconnects may be defined on and/or around the broken tether portion protruding from the edge of the die(s) 400 in some embodiments.

Because the VCSELs 400 are completed via epitaxial lift-off and thus are separated from the substrate and/or because of the use of thin film interconnects, the VCSELs 400 may also be thinner than some conventional VCSELs which remain connected to their native substrate, such as the VCSEL 10 of FIG. 2C. For example, the VCSEL 400 may have a thickness t (e.g., a combined thickness of the semiconductor stack including the layers 406, 401, 405, and 402) of about 1 micrometers (μm) to about 20 μm.

FIGS. 5A-5C are images of VCSEL arrays 500 in accordance with some embodiments described herein, which were assembled using micro-transfer printing processes. In particular, FIG. 5A illustrates a VCSEL array 500 of about 11,000 lasers with an inter-VCSEL spacing of about 200 micrometers (μm) or less between adjacent VCSELs 200 after assembly on a non-native substrate 507, with the inset image of FIG. 5B and the image of 5C illustrating a magnified views of portions of the array 500 including about 350 lasers and 9 lasers, respectively, in accordance with some embodiments described herein. Due to the reduction in dimensions of the VCSELs described herein, the inter-VCSEL spacing between immediately adjacent VCSELs 200 may be less than about 150 µm, or less than about 100 µm or less than about 50 µm on the source substrate in some embodiments. In some embodiments, the array 500 may include 100 VCSELs or more within a footprint or area of 5 square millimeters (mm$^2$) or less.

Figure 5D:
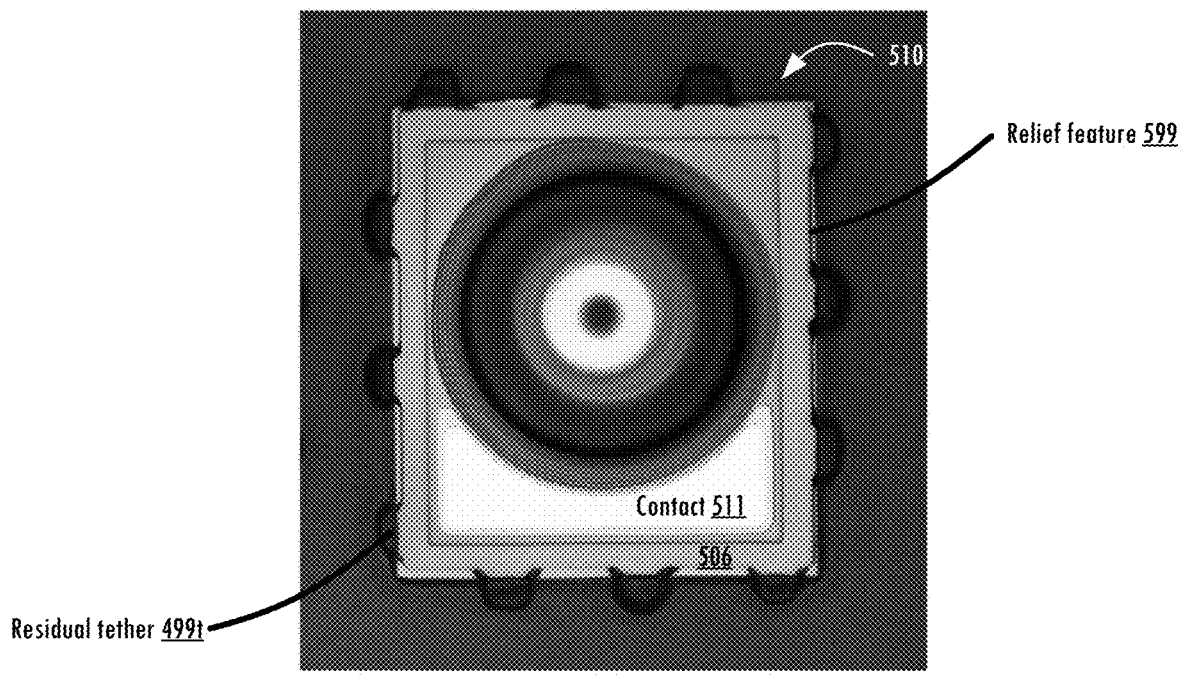
FIGS. 5D-5E are magnified images illustrating residual tether portions and relief features of VCSELs in accordance with some embodiments described herein.
Figure 5E:
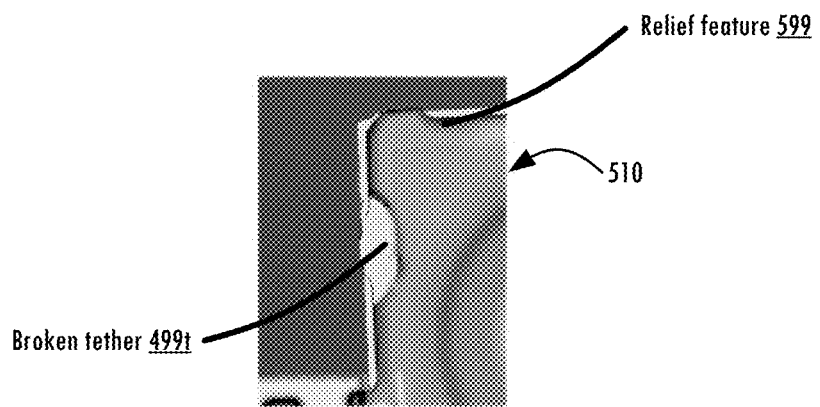

FIGS. 5D-5E are magnified images illustrating broken tether portions and relief features of VCSEL structures in accordance with some embodiments described herein. As shown in FIGS. 5D and 5E, a transfer-printed VCSEL 510 (such as one of the VCSELs 200) or other laser diode as described herein may include one or more broken tether portions 499t and/or relief features 599 at a periphery thereof. The relief features 599 may be patterned or otherwise provided along the periphery of VCSEL 510 to partially define the tethers 499 and areas for preferential fracture of the tethers 499. In the examples of FIGS. 5D-5E, the broken tether portions 499t and relief features 599 are illustrated as being present along a periphery of the lateral conduction layer (LCL) 506; however, it will be understood that broken tether portions 499t and/or relief features 599 may be present in or along a periphery of any of the layers that may be provided on a non-native substrate by transfer-printing processes described herein, for example, any of the epitaxially grown layers 406, 405, 401, 402 formed in fabricating the active region 405 on a source wafer or substrate 404 in the examples of FIGS. 4A-4F and 4A'-4G'. As such, in some embodiments, the broken tether portion 499t may comprise a material and thickness corresponding to that of the LCL layer 506 (or other layer associated with the active region). In further embodiments, to shorten an etch sequence, peripheral or edge portions of the LCL 506 may be partially etched, and as such, the relief pattern 599 of the tether features 499t may be thinner than the LCL 506 (or other layer associated with the active region). The fracture of the tethers 499 during the "Pick" operation (such as shown in FIG. 4G') may occur in the resist layer 4991 itself, and the broken tether portions 499t may comprise a material and thickness corresponding to that of the resist layer 4991. The broken tether portion 499t may interact with the print adhesive or epoxy, and also remains on the fully processed device, even after resist develop and/or resist removal processes. More generally, some laser diode structures in accordance with embodiments described herein may include at least one of a broken tether portion 499t or a relief pattern or feature 599 at areas adjacent the tethers 499 along a periphery or edge of the laser diode structure.

Accordingly, some embodiments described herein may use MTP to print and integrate hundreds or thousands of VCSELs or other surface-emitting laser diodes into small-footprint light-emitting arrays. MTP may be advantageous by allowing simultaneous manipulation and wafer-level assembly of thousands of laser diode devices. In some embodiments, each of the laser diodes may have aperture dimensions as small as about 1-10 µm, thereby reducing the size (and cost) of lasers incorporating such VCSEL arrays by a factor of up to 100. Other embodiments may include substrates with aperture dimensions even smaller than about 1 µm in order to realize different performance such as modified near and far field patterns. Still other embodiments may use larger apertures, for example, about 10-100 µm, in order to realize higher power output per VCSEL device. Also, MTP allows reuse of the source wafer (e.g., GaAs or InP) for growth of new devices after the transfer printing process, further reducing fabrication costs (in some instances, by up to 50%). MTP may also allow heterogeneous integration and interconnection of laser diodes of different material systems (e.g., GaAs or InP lasers) and/or driver transistors (as discussed below) directly onto silicon integrated circuits (ICs). Also, source wafers may be used and reused in a cost-effective manner, to fabricate laser diodes (e.g., InP-based VCSELs) that can provide high power with eye safety, as well as reduced ambient noise. As such, MTP may be used in some embodiments to reduce emitter costs, and allow fabrication of high power, high resolution distributed VCSEL arrays (DVAs) including multiple hundreds or thousands of VCSELs.

Also, when provided on flexible or curved substrates, embodiments described herein can provide DVAs having a wide field of view (FoV), up to 180 degrees horizontal. In some embodiments, the optical power dispersed via the DVA can be configured for eye safety and efficient heat dissipation. In some embodiments, low-cost, self-aligning, beam forming micro-optics may be integrated within the curved DVA.

Figure 6A:
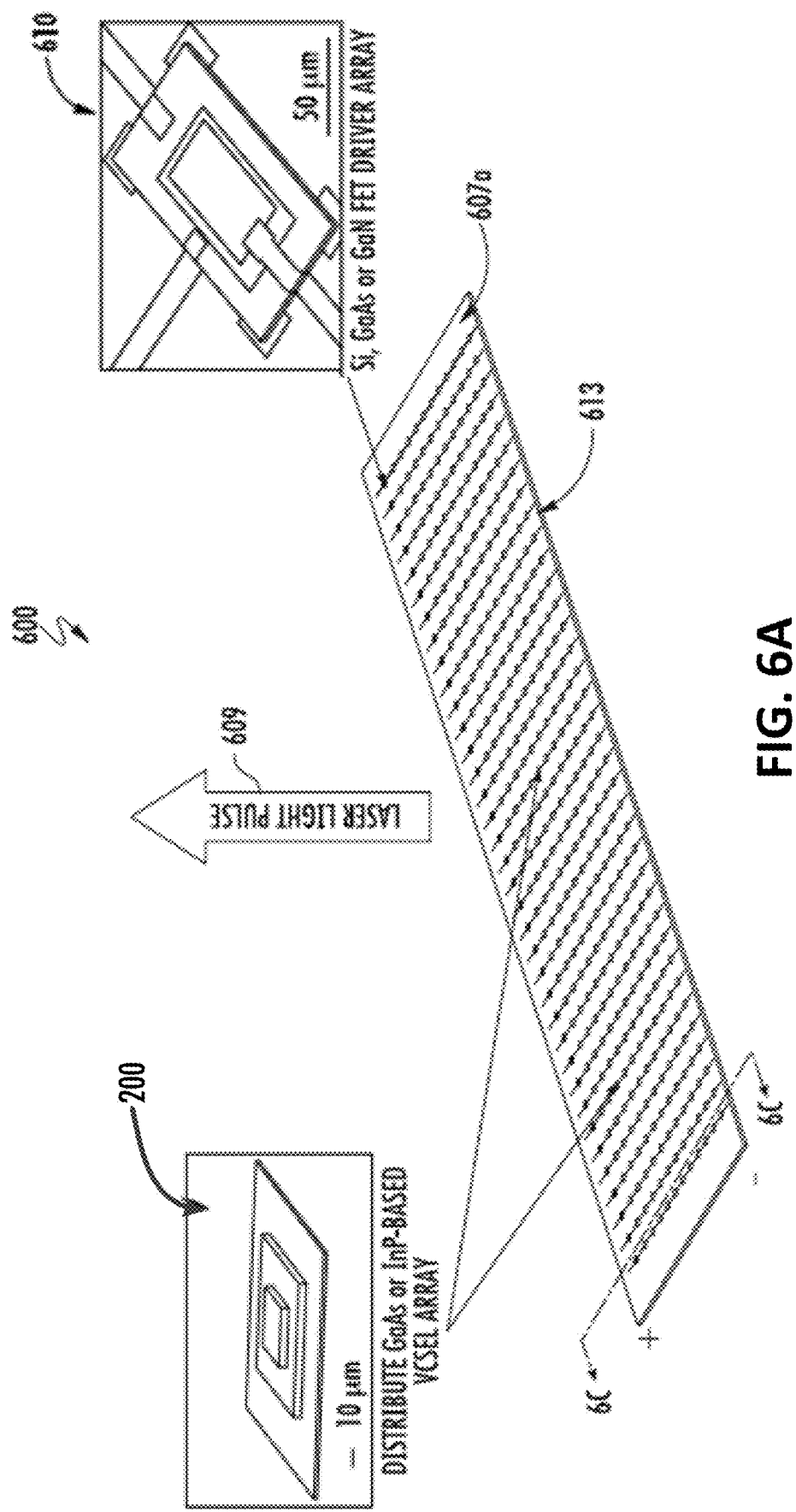
FIG. 6A is a perspective view illustrating an example emitter array including heterogeneous integration of distributed laser diodes and distributed driver transistors in accordance with some embodiments described herein.
Figure 6B:
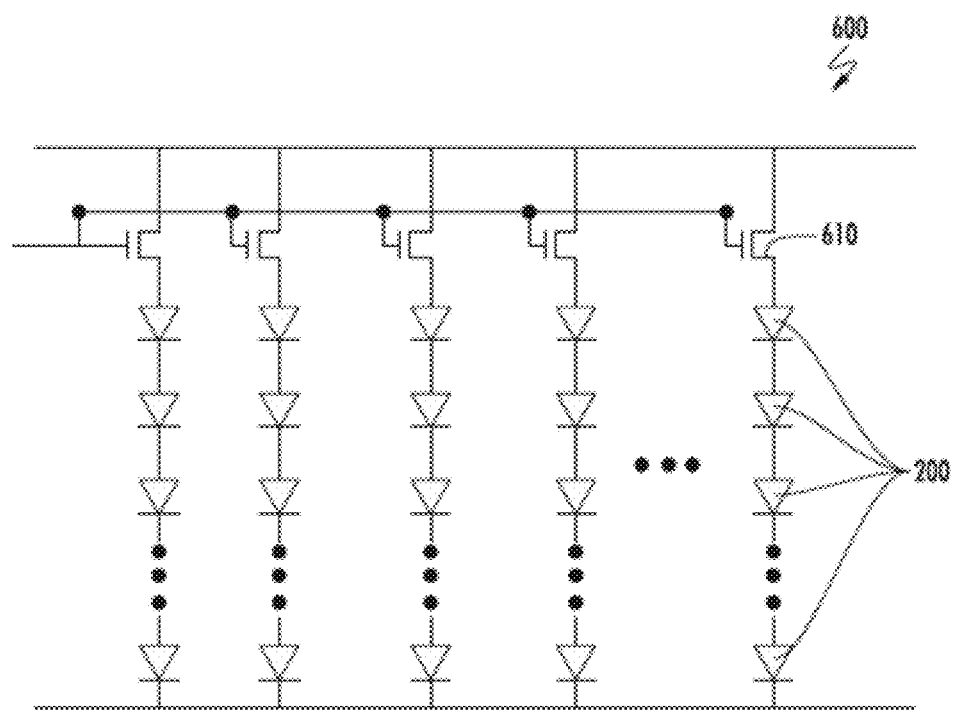
FIG. 6B is schematic view illustrating an equivalent circuit diagram for the distributed emitter array of FIG. 6A.

FIG. 6A is a perspective view illustrating an example emitter array 600 including heterogeneous integration of distributed surface-emitting laser diodes (illustrated as VCSELs 200) and distributed driver transistors 610 in accordance with some embodiments described herein. As used herein, distributed circuit elements may refer to laser diodes, driver transistors, and/or other circuit elements that are assembled in various desired positions throughout a laser diode array, and such an array of distributed circuit elements is referred to herein as a distributed array. In some embodiments, the distributed array may be a two-dimensional array including rows and columns. For example, integration of distributed high power driver transistors in a distributed VCSEL array may be advantageous for LIDAR applications. FIG. 6B is schematic view illustrating an equivalent circuit diagram for the distributed emitter array 600 of FIG. 6A, and FIG. 6C is a cross-sectional view of the distributed emitter array 600 taken along line 6C-6C' of FIG. 6A.

Figure 6C:
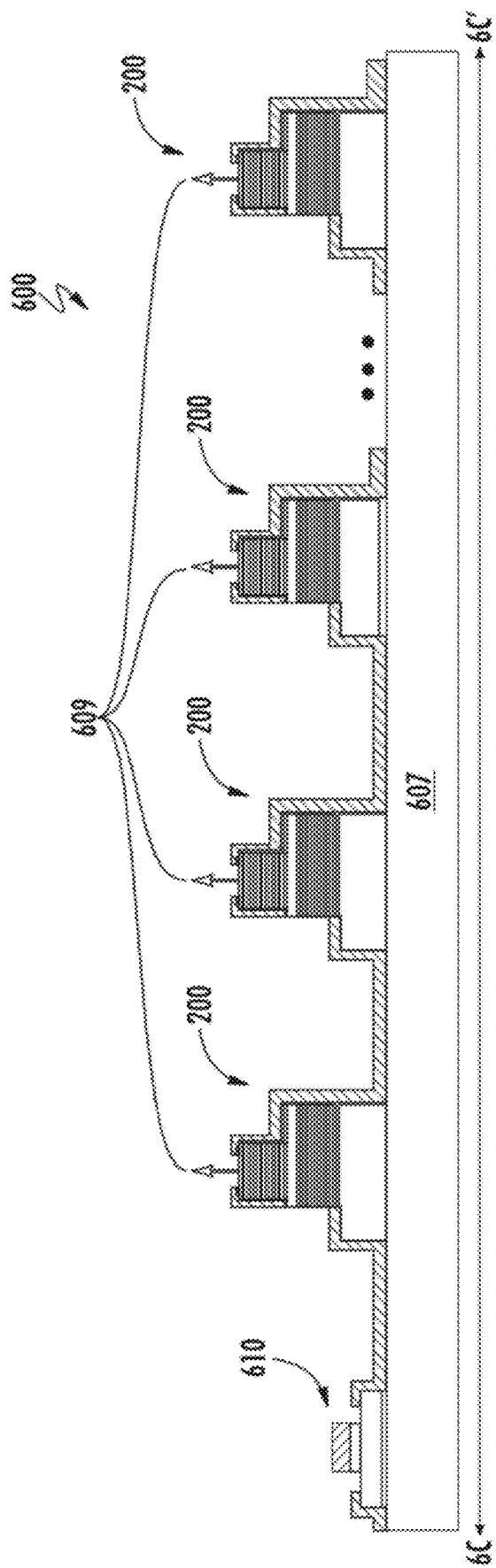
FIG. 6C is a cross-sectional view of the distributed emitter array taken along line 6C-6C' of FIG. 6A.

As shown in FIGS. 6A-6C, the array 600 (also referred to herein as a DVA) may be assembled on a non-native substrate 607, for example, by micro-transfer printing or other techniques. The substrate 607 may be rigid in some embodiments, or may be flexible in other embodiments. The array 600 further includes integrated driver transistors 610 that are assembled on the substrate 607 adjacent to one or more of the VCSELs 200. For example, the driver transistors 610 may be assembled on the substrate 607 using a micro-transfer printing (MTP) process. In some embodiments, an array including hundreds or thousands of driver transistors 610 may be provided. Electrically conductive thin-film interconnects 613 may be formed to electrically connect respective contacts of the driver transistors 610 and laser diodes 200 in series and/or parallel configurations. Spacings between a driver transistor 610 and an immediately adjacent laser diode 200 may be less than about 2 millimeters, less than about 1 millimeter, less than about 500 micrometers, less than about 150 micrometers (µm), or in some embodiments, less than about 100 µm, or less than about 50 µm, which may provide reduced parasitic impedance therebetween (e.g., up to 100 times lower than where the driver transistor 610 is located off-chip or off-substrate).

In some embodiments, the array 600 may include wiring 613 between VCSELs 200 that are not connected in parallel (e.g., no common cathode/anode). Interconnection designs that do not simply place all elements of the array in parallel (e.g., without a common anode or cathode connection) may offer the advantage of lowering current requirements for the array, which can reduce inductive losses and increase switching speed. Varied interconnection designs also provide for the inclusion of other devices embedded or integrated within the electrically interconnected array (e.g., switches, gates, FETs, capacitors, etc.) as well as structures which enable fault tolerance in the manufacture of the array (e.g. fuses, bypass circuits, etc.) and thus confer yield advantages. For example, as illustrated in FIG. 6B, the array 600 includes a plurality of strings of VCSELs 200 that are electrically connected in series (or anode-to-cathode) to define columns (or other subsets or sub-arrays) of the array 600. The array 600 further includes an array of driver transistors 610, with each driver 610 electrically connected in series with a respective string of serially-connected (or otherwise anode-to-cathode-connected) VCSELs 200.

The conductive thin-film interconnects 613 may be formed in a parallel process after providing the laser diodes 200 and driver transistors 610 on the substrate 607, for example by patterning an electrically conductive film using conventional photolithography techniques. As such, the driver transistors 610 and laser diodes 200 of the array 600 are free of wire bonds and/or electrical connections through the substrate 607. Due to the smaller dimensions of the laser diodes 200 and the driver transistors 610 and the degree of accuracy of the assembly techniques described herein, a spacing between immediately adjacent laser diodes 200 and/or driver transistors 610 may be less than about 150 micrometers (μm), or in some embodiments, less than about 100 μm or less than about 50 μm. Integrating the driver transistors 610 on the substrate 607 in close proximity to the VCSELs 200 (for example, at distances less than about 2 millimeters, less than about 1 millimeter, less than about 500 micrometers, less than about 150 micrometers (μm), or in some embodiments, less than about 100 μm, or less than about 50 μm from a nearest VCSEL 200) may thus shorten the electrical connections 613 between elements, thereby reducing parasitic resistance, inductance, and capacitance (e.g., a parasitic impedance), and allowing for faster switching response. In some embodiments, the use of processes such as, for example, micro-transfer printing, electrostatic adhesion, or other mass transfer techniques, may allow for the arrangement of VCSELs 200 and driver transistors 610 that may otherwise be process-incompatible (e.g., made by different processes that may utilize operations and/or materials that are otherwise difficult to integrate). In a conventional system not using such procedures, equivalent driver electronics may be placed further away and/or off-chip from the emitter structures at least in part due to the different processes that are used to construct them. In some embodiments as described herein, however, the driver transistors 610 and VCSELs 200 may be placed in closer proximity. Thus, though they driver transistors 610 and VCSELs 200 may be placed as close as 150 μm, benefits over conventional devices may be achieved even at further distances, including 5 mm, 2 mm, and/or 1 mm. Devices constructed according to some embodiments described herein may have a parasitic impedance that is less than one hundred times that of a conventional device, allowing for much more rapid switching capabilities.

In the example of FIGS. 6A-6C, the driver transistors 610 are arranged in an array such that each driver transistor 610 is connected in series with a column (or other subset) of serially-connected (or otherwise anode-to-cathode-connected) VCSELs 200, allowing for individual control of respective columns/strings of VCSELs 200. However, it will be understood that embodiments described herein are not limited to such a connection configuration. To the contrary, integrating the driver transistors 610 in close proximity to the VCSELs 200 may also allow for greater flexibility in wiring configurations (e.g., in series and/or parallel), which may be used to control current and/or increase or maximize performance. For example, fewer or more driver transistors 610 may be provided (e.g., drivers for control of rows of serially-connected VCSELs 200 as well as columns) for finer control of respective VCSELs or groups of VCSELs and/or output power. Another example would be the addition of capacitors or similar electrical storage devices close to the elements of the array for faster pulse generation, for example, on the order of sub-nanosecond (ns), in contrast to some conventional designs that may be on the order of about 1-10 ns or more. Likewise, although illustrated as a planar array 600, the substrate 607 may be flexible in some embodiments; thus, the array 600 may be bent to provide a desired curvature, similar to the array 300b of FIG. 3B.

As similarly discussed above with reference to the arrays 300a and 300b, the array 600 may be scalable based on a desired quantity or resolution of laser diodes 200, allowing for long range and high pulsed power output (on the order of kilowatts (kW)). The distribution of the laser diodes 200 on the surfaces of the substrate 607 can be selected and/or the operation of the laser diodes can be dynamically adjusted or otherwise controlled (via the transistors 610) to reduce optical power density, providing both long range and eye safety at a desired wavelength of operation (e.g., about 905 nm for GaAs VCSELs; about 1500 nm for InP VCSELs). Also, the spacing between elements 200 and/or 610 may be selected to provide thermal management and improve heat dissipation during operation. Arrays 600 as described herein may thereby provide improved reliability, by eliminating wire bonds, providing a fault-tolerant architecture, and/or providing lower operating temperatures. In further embodiments, self-aligning, low-cost beam forming micro-optics (e.g., ball lens arrays) may be integrated on or into the surface of the substrate 607.

Figure 6D:
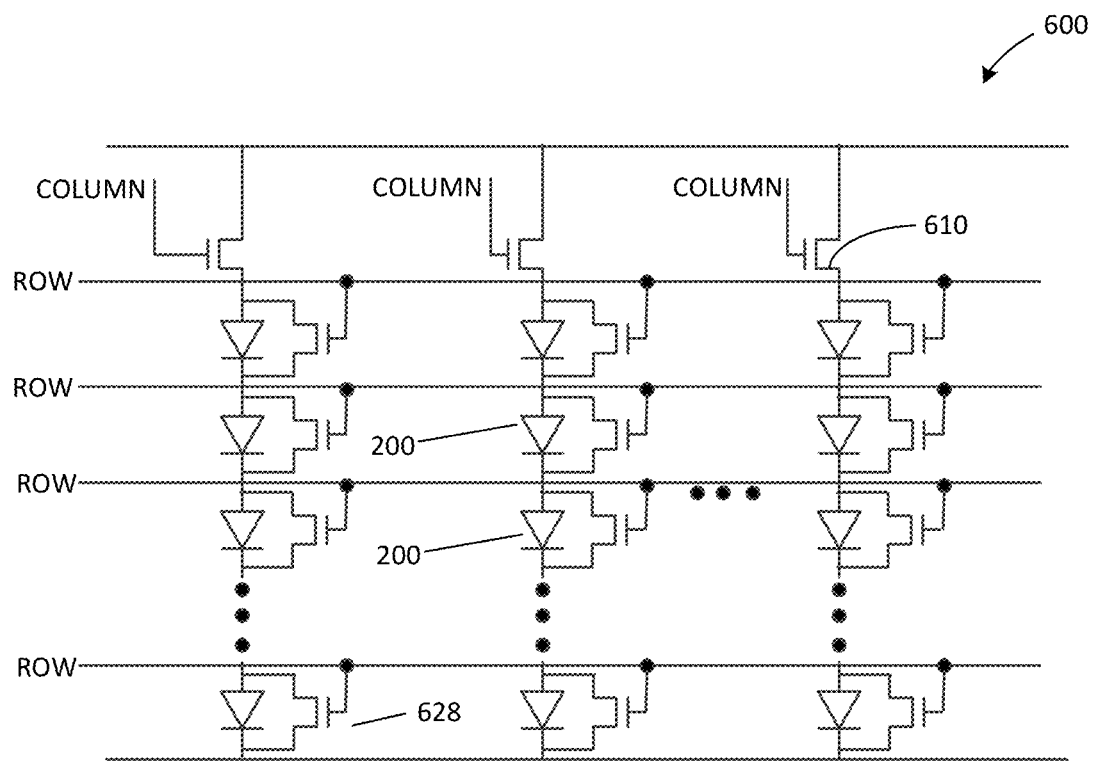
FIG. 6D is a schematic view illustrating an alternate equivalent circuit diagram for the distributed emitter array of FIG. 6A.

FIG. 6D is a schematic view illustrating an equivalent circuit diagram of the distributed emitter array 600 of FIG. 6A in which the emitters 200 are individually addressable. As illustrated in FIG. 6D, the array 600 includes a plurality of strings of VCSELs 200 that are electrically connected in series (or anode-to-cathode) to define columns (or other subsets or sub-arrays) of the array 600. The array 600 further includes an array of driver transistors 610, with each driver transistor 610 electrically connected in series with a respective string of serially-connected VCSELs 200. The driver transistors 610 may be individually addressable via column signals COLUMN. In some embodiments, the driver transistors 610 may be individually activated (e.g., biased so as to be conducting) so as to vary power provided to a respective string of the serially-connected VCSELs 200. In some embodiments, the driver transistors 610 may be operated in linear mode so as to vary a resistance of the driver transistor 610 and accordingly vary a current applied to the string of serially-connected VCSELs 200.

Rows of the array 600 may also be individually addressable. For example, the array 600 may utilize bypass circuits to individually select one of the rows of the string of serially connected VCSELs 200. In some embodiments, individual bypass transistors 628 may be utilized to select respective ones of the VCSELs 200. For example, to select a particular VCSEL 200 at a particular row and column, the driver transistor 610 for the string containing the particular VCSEL 200 may be activated to provide current through the string, and the bypass transistor 628 associated with the particular VCSEL 200 may be turned off (e.g., biased so as to be non-conducting) so that current through the string may flow through the VCSEL 200. In some embodiments, the bypass transistor 628 may be operated in linear mode to provide a variable resistance along the bypass path. The variable resistance may allow for control of the amount of current flowing through the VCSEL 200.

The circuit embodiment of FIG. 6D is merely an example of how the array of emitters 600 may be configured to be both row and column addressable. However, the embodiments described herein are not limited to this particular arrangement. One of ordinary skill in the art will recognize that other potential circuit arrangements are possible to implement an active matrix of devices that may be selectively addressed by both row and column, for example, to direct a larger fraction of pulse energy to some subset of the VCSELs in order to modify the far field pattern of the emitted output beam, such that only certain directions are receiving a greater amount of power. Such circuit arrangements may be used instead of the circuit arrangement of FIG. 6D without deviating from the scope of the embodiments described herein.

Figure 7A:
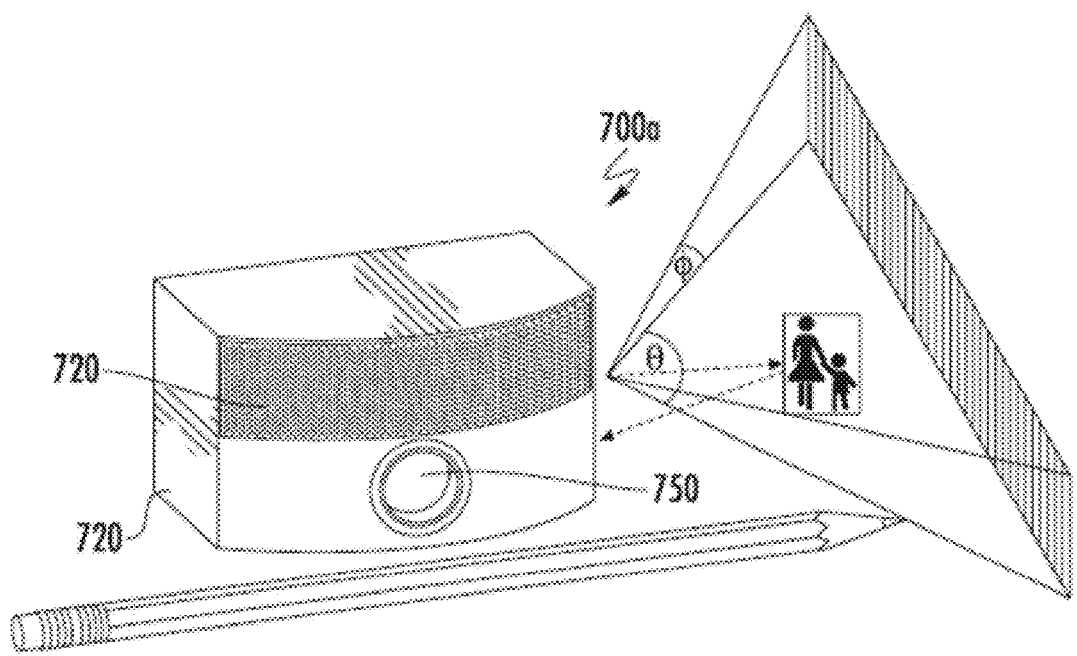
FIG. 7A is a perspective view illustrating an example LIDAR device in accordance with some embodiments described herein.

FIG. 7A is a perspective view illustrating a LIDAR device 700a including surface-emitting laser diodes (such as the VCSELs 200) in accordance with embodiments described herein, illustrated relative to a pencil for scale. FIG. 7C is a perspective view illustrating an alternative LIDAR device 700c in accordance with embodiments described herein. In particular, FIGS. 7A and 7C illustrate a distributed vertical-cavity-surface-emitting laser (VCSEL) array-based, solid-state Flash LIDAR device 700a, 700c. The LIDAR device 700a, 700c is illustrated with reference to a curved array 720, such as the curved array 300b of FIG. 3B, but it will be understood that the LIDAR device 700a, 700c is not so limited, and may alternatively implement the array 300a of FIG. 3A, the array 600 of FIGS. 6A-6C, and/or other arrays of laser diodes 200 that provide features described herein. Such features of the device 700a, 700c may include, but are not limited to, broad field of view (in particular embodiments, about θ=120° horizontal by φ=10° vertical, or broader); long range (in some instances, greater than about 200 m); high resolution (in particular embodiments, about 0.1° horizontal and vertical) compact size defined by reduced dimensions (in particular embodiments, about 110× 40×40 mm); high power (in particular embodiments, about 10,000 w peak, pulsed); and eye safety (in particular embodiments, dispersed optical power can support eye safe, high power, 905 nm (e.g., GaAs) and/or about 1500 nm (e.g., InP) emitters).

Figure 7B:
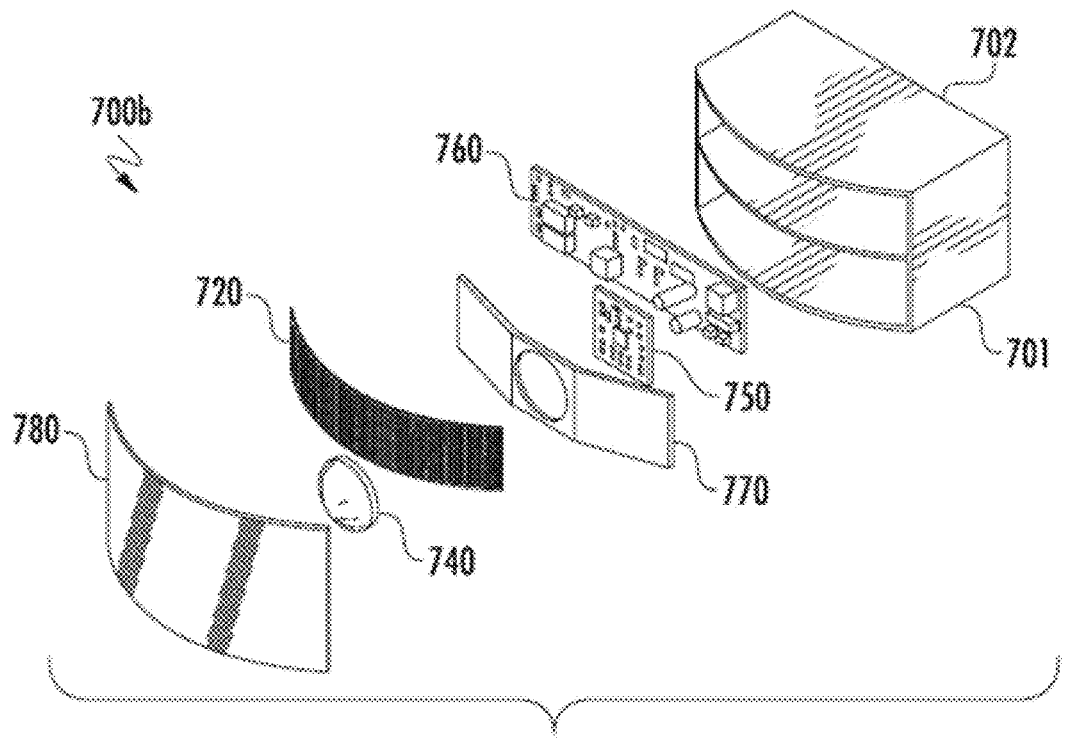
FIG. 7B is an exploded view illustrating example components of the LIDAR device of FIG. 7A.
Figure 7C:
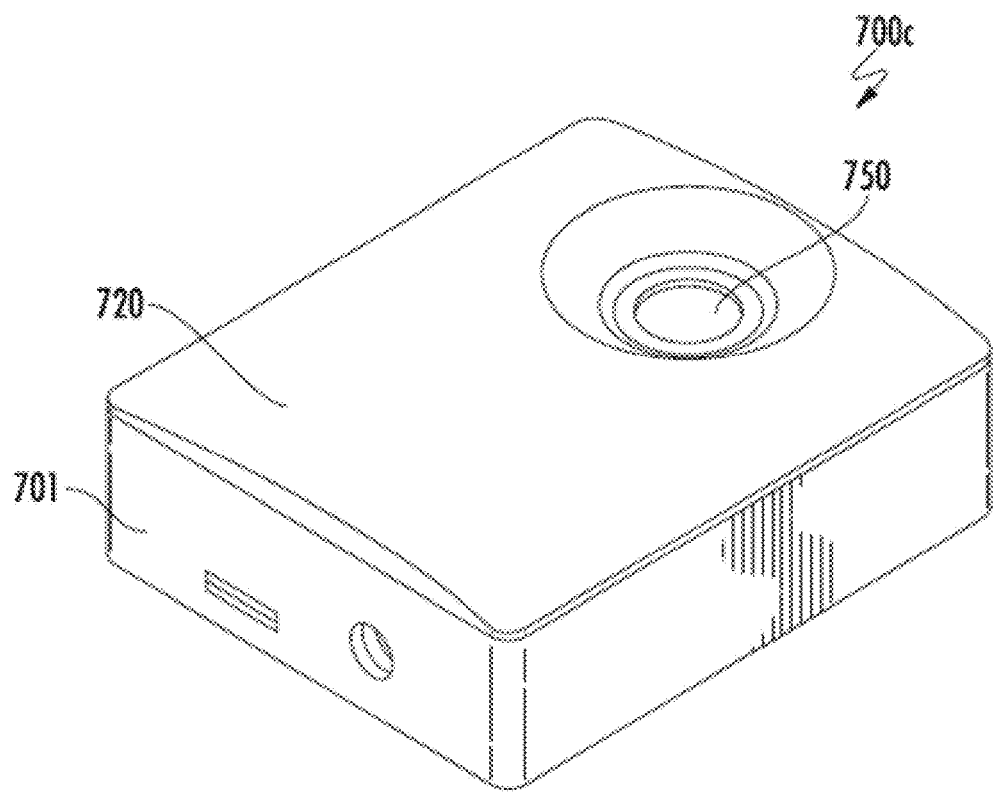
FIG. 7C is a perspective view illustrating another example LIDAR device in accordance with some embodiments described herein.

FIG. 7B is an exploded view 700b illustrating components of the LIDAR device 700a of FIG. 7A. As shown in FIG. 7B, the device housing or enclosure 701 includes a connector 702 for electrical connection to a power source and/or other external devices. The enclosure 701 is sized to house a light emitter array 720, a light detector array 730, electronic circuitry 760, detector optics 740 (which may include one or more lenses and/or optical filters), and a lens holder 770. A transparent cover 780 is provided to protect the emitter array 720 and detector optics 740, and may include beam shaping and/or filtering optics in some embodiments.

The light emitter array 720 may be a pulsed laser array, such as any of the VCSEL arrays 300a, 300b, 600 described herein. As such, the light emitter array 720 may include a large quantity (e.g., hundreds or even thousands) of distributed, ultra small laser diodes 200, which are collectively configured to provide very high levels of power (by exploiting benefits of the large number of very small devices). Using a large number of small devices rather than a small number of large devices allows devices that are very fast, low power and that operate at a low temperature to be integrated in an optimal configuration (with other devices, such as transistors, capacitors, etc.) to provide performance not as easily obtained by a small number of larger laser devices. As described herein the laser diodes 200 may be transfer printed simultaneously onto a non-native curved or flexible substrate in some embodiments. Beam shaping optics that are configured to project high aspect ratio illumination from the light emitter array 720 onto a target plane may also be provided on or adjacent the light emitter array 720.

The light detector array 730 may include one or more optical detector devices, such as pin, pinFET, linear avalanche photodiode (APD), silicon photomultiplier (SiPM), and/or single photon avalanche diode (SPAD) devices, which are formed from materials or otherwise configured to detect the light emitted by the light emitter array 720. The light detector array 730 may include a quantity of optical detector devices that are sufficient to achieve a desired sensitivity, fill factor, and resolution. In some embodiments, the light detector array 730 may be fabricated using microtransfer printing processes as described herein. The detector optics 740 may be configured to collect high aspect ratio echo and focus target images onto focal plane of the light detector array 730, and may be held on or adjacent the light detector array 730 by the lens holder 770.

The electronic circuitry 760 integrates the above and other components to provide multiple return LIDAR point cloud data to data analysis. More particularly, the electronic circuitry 760 is configured to control operation of the light emitter array 720 and the light detector array 730 to output filtered, high-quality data, such as 3D point cloud data, to one or more external devices via the connector 702. The external devices may be configured to exploit proprietary and/or open source 3D point cloud ecosystem and object classification libraries for analysis of the data provided by the LIDAR device 700a, 700c. For example, such external devices may include devices configured for applications including but not limited to autonomous vehicles, ADAS, UAVs, industrial automation, robotics, biometrics, modeling, augmented and virtual reality, 3D mapping, and/or security.

Figure 8:
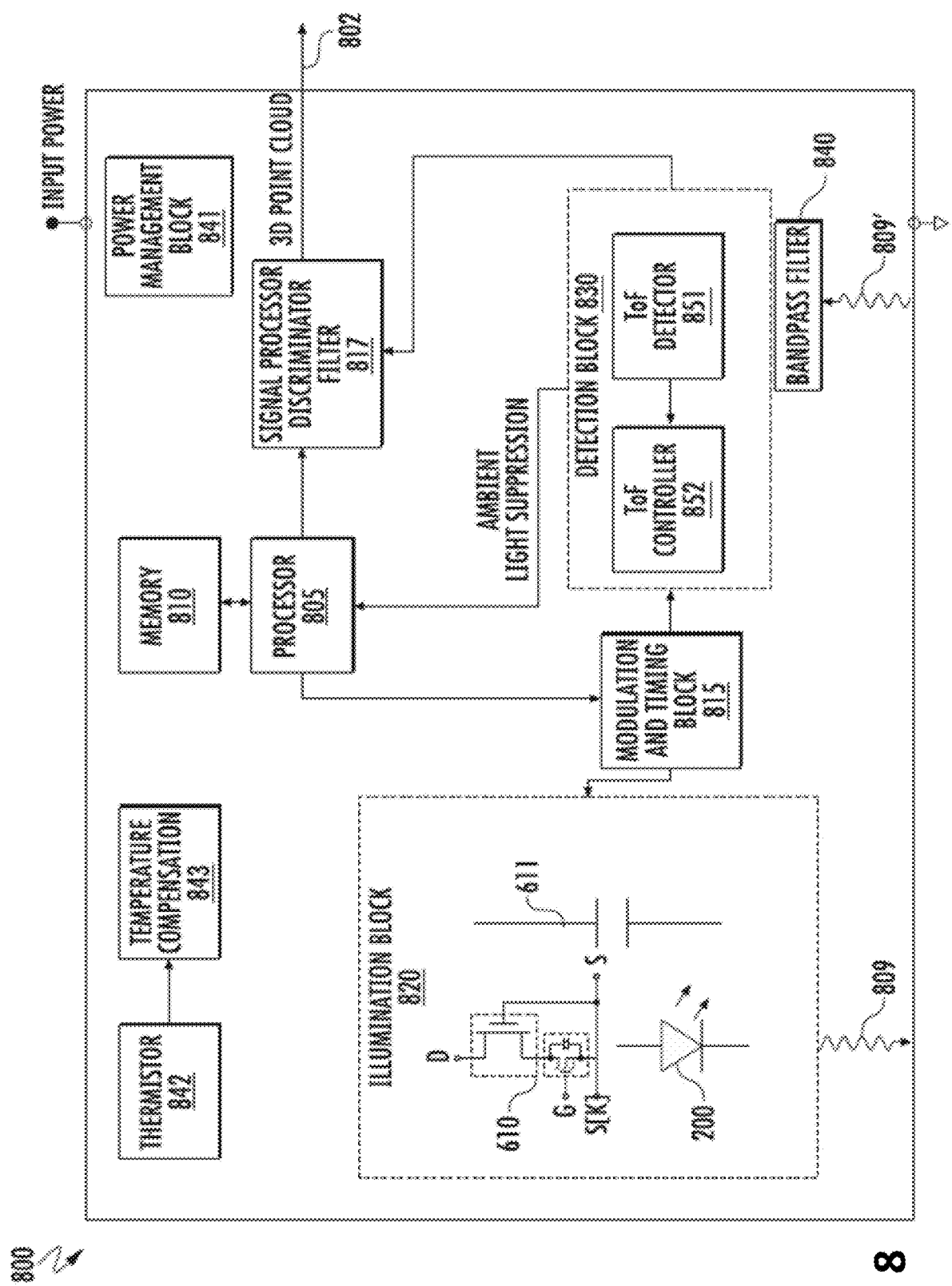
FIG. 8 is a block diagram illustrating an example system architecture for a LIDAR device in accordance with some embodiments described herein.

FIG. 8 is a block diagram illustrating an example system 800 for a LIDAR device, such as the LIDAR device 700a, 700b, 700c of FIGS. 7A-7C, in accordance with some embodiments described herein. As shown in FIG. 8, the system 800 integrates multiple electrically coupled integrated circuit elements to provide the LIDAR device functionality described herein. In particular, the system 800 includes a processor 805 that is coupled to a memory device 810, an illumination circuit 820, and a detection circuit 830. The memory device 810 stores computer readable program code therein, which, when executed by the processor, operates the illumination circuit 820 and the detection circuit 830 to collect, process, and output data, such as 3D point cloud data, indicative of one or more targets in the operating environment. The system 800 may further include a thermistor 842 and associated temperature compensation circuit 843, as well as a power management circuit 841 that is configured to regulate voltage or power to the system 800.

The illumination circuit 820 includes an array of discrete surface-emitting laser diodes 200, driver transistor(s) 610, and associated circuit elements 611, electrically connected in any of various configurations. In some embodiments, the illumination circuit 820 may be a laser array including rows and/or columns of VCSELs 200, such as any of the VCSEL arrays 300a, 300b, 600 described herein. Operation of the illumination circuit 820 to emit light pulses 809 may be controlled by the processor 805 via a modulation and timing circuit 815 to generate a pulsed light output 809. Beam-shaping and/or focusing optics may also be included in or adjacent the array of laser diodes 200 to shape and/or direct the light pulses 809.

The detection circuit 830 may include a time-of-flight (ToF) detector 851 coupled to a ToF controller 852. The ToF detector 851 may include one or more optical detector devices, such as an array of discrete pin, pinFET, linear avalanche photodiode (APD), silicon photomultiplier (SiPM), and/or single photon avalanche diode (SPAD) devices. The ToF controller 852 may determine the distance to a target by measuring the round trip ("time-of-flight") of a laser pulse 809' reflected by the target and received at the ToF detector 851. In some embodiments, the reflected laser pulse 809' may be filtered by an optical filter 840, such as a bandpass filter, prior to detection by the ToF detector 851. The output of the detection block 830 may be processed to suppress ambient light, and then provided to the processor 805, which may perform further processing and/or filtering (via signal processor discriminator filter 817, and may provide the filtered output data (for example, 3D point cloud data) for data analysis. The data analysis may include frame filtering and/or image processing. In some embodiments, the data analysis may be performed by an external device, for example, an autonomous vehicle intelligence system.

FIG. 9 is a cross-sectional view illustrating an example laser diode array 900 including edge-emitting laser diodes 910 in accordance with further embodiments described herein. As shown in FIG. 9, a laser diode 910 includes an active region 905 (which may include one or more quantum wells) for generation and emission of coherent light 909. The active region 905 is provided between p-type and n-type layers 901 and 902, with contacts 912 and 911 thereon, respectively. A diffraction grating layer may be included to provide feedback for lasing. The optical cavity axis of the laser diode 910 is oriented perpendicular to the direction of current flow, defining an edge-emitting device, so that the radiation 909 emerges from the edge of the device 910 rather than from a top surface thereof. The devices 910 may be assembled on a non-native substrate 907, for example, by micro-transfer printing, electrostatic adhesion, or other mass transfer techniques. Respective mirror elements (illustrated as micro-steering mirrors 913) may also be assembled on the substrate 907 (for example, by micro-transfer printing, electrostatic adhesion, or other mass transfer techniques), and oriented relative to the optical cavity axis of a laser diode 910 that is to be provided adjacent thereto, such that the radiation 909 from the laser diode 910 is reflected and ultimately emitted in a direction perpendicular to the substrate 907.

The substrate 907 may be rigid in some embodiments, or may be flexible in other embodiments, and electrically conductive thin-film interconnects may be formed to electrically connect respective contacts of the laser diodes 910 in series and/or parallel configurations, at spacings similar to those described with reference to the arrays 300a, 300b, and/or 600 herein. Likewise, as described above with reference to the examples of FIGS. 6A-6C, the array 900 may include other types of devices and/or devices formed from different materials (e.g., power capacitors, FETs, micro-lens arrays, etc.) integrated with the laser diodes 910 on the substrate 907 at the spacings described herein.

Figure 10A:
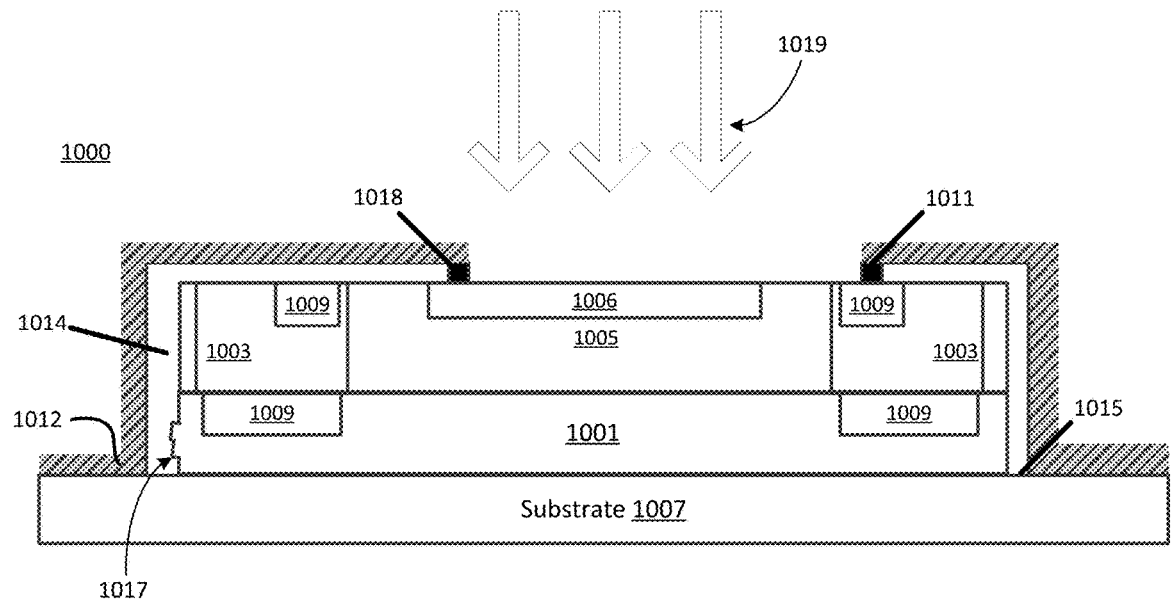
FIGS. 10A and 10B are cross-sectional views of examples of a detector having reduced dimensions in accordance with some embodiments described herein.
Figure 10B:
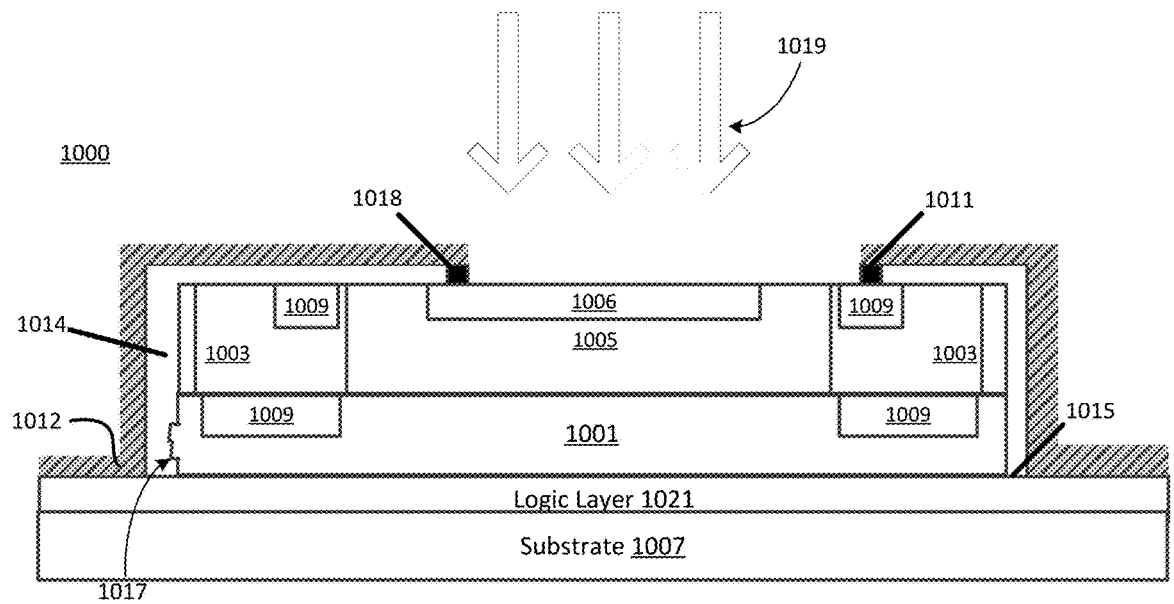

The VCSEL arrays described herein may be advantageously used with existing TOF devices, such as existing detector arrays utilizing pin, pinFET, linear APD, SiPM, and/or SPAD devices. In some embodiments, the MTP techniques described herein may additionally be utilized in manufacturing photo detectors (also referred to herein as "detectors") and/or photo detector arrays. FIGS. 10A and 10B are cross-sectional views of examples of a detector 1000 having reduced dimensions in accordance with some embodiments described herein. The detector 1000 may be fabricated using micro-transfer printing, electrostatic adhesion, or other mass transfer techniques.

Referring to FIG. 10A, the detector 1000 may include a first epitaxial layer 1001 and a second epitaxial layer 1005. In some embodiments, the first epitaxial layer 1001 may be a p-layer and the second epitaxial layer 1005 may be an n-epitaxial layer. The first epitaxial layer 1001 may include a buried layer 1009. In some embodiments, the buried layer 1009 may be a p buried layer. The second epitaxial layer 1005 may include well regions 1003. In some embodiments, the well regions 1003 may be p-type well regions. The well regions 1003 may additionally include first contact layers 1009. In some embodiments, the first contact layers 1009 may be p+ contact layers. The second epitaxial layer 1005 may further include a second contact layer 1006. In some embodiments, the second contact layer 1006 may be an n+ layer. The first contact layers 1009 may be connected to anode 1011, and the second contact layer 1006 may be connected to cathode 1018. Electrical interconnects 1012 may be connected to anode 1011 and cathode 1018 respectively. The electrical interconnects 1012 may be isolated from the various layers of the detector 1000 by insulating layer 1014, though, in some embodiments, the insulating layer 1014 may be optional. Though the description herein highlights some conductivity types and associated concentrations for the detector 1000 of FIG. 10A, it will be understood that other configurations are possible without deviation from the spirit and scope of the embodiments discussed herein.

The detector 1000 is configured to detect incident light 1019 striking the detector 1000 and generate an electrical signal based on the detected light. In some embodiments, by adjusting a biasing voltage applied to the anode 1011 and/or cathode 1018, a sensitivity of the detector 1000 may be adjusted. In other words, by altering a biasing of the detector 1000, the response of the detector 1000 to the incident light 1019 may be adjusted, thereby making the system level sensitivity or output of the detector 1000 adjustable.

The detector 1000 may be formed on a source wafer and placed on a non-native substrate 1007 in a manner similar to that described with respect to FIGS. 4A-4F and 4A'-4H'. In some embodiments, the detector 1000 may be individually placed as a discrete device. For example, the detector 1000 may be formed to have a tether 1017 that may be selectively broken such that the detector 1000 may be transferred to the non-native substrate 1007. For example, a stamp may be used to break anchor structures to release the detector 1000 from a source wafer, adhere the detector 1000 to a surface of the stamp, and simultaneously transfer the multiple detector 1000 to the non-native substrate 1007 by contacting the surface of the stamp including the detectors 1000 thereon with the non-native substrate 1007, defining print interfaces 1015 therebetween. In some embodiments, the print interface 1015 between the detector 1000 and the non-native substrate 1007 may include an adhesive layer. As a result of the MTP processing, tether artifacts 1017 may remain as part of the detector 1000. For example, the detector 1000 may exhibit tethers and/or relief features such as those described herein with respect to the VCSEL 200 (e.g., FIGS. 5D and 5E).

Embodiments described herein may allow for the formation of detectors 1000 that have a reduced individual dimension. For example, as part of an MTP process, the detector 1000 may be printed directly on the non-native substrate 1007. In some embodiments, the detector 1000 may be printed on supporting circuitry to realize an array of detectors 1000 having sizes defined by dimensions (e.g., length, width, and/or diameter) of about 100 micrometers (μm) to about 200 μm. In some embodiments, the dimensions are about 4 to about 40 μm. In some embodiments, the dimensions are about 30 μm. In some embodiments, the detectors may be spaced apart from one another by less than 150 μm, but the embodiments described herein are not limited thereto. In some embodiments, the detectors may be spaced apart from one another by less than 20 μm. In some embodiments, the detectors may be spaced apart from one another by less than 5 μm. In some embodiments, the detectors may be spaced apart from one another by less than 2 μm.

Referring to FIG. 10B, the detector 1000 may be disposed, as part of the MTP processing, on other circuit layers. For example, a logic layer 1021 may be between the detector 1000 and the substrate 1007. The logic layer 1021 may contain additional circuitry, such as support circuitry (e.g., additional detector logic) for the detector 1000. In some embodiments, the logic layer 1021 may contain ToF support circuits such as ToF processing circuits and/or ToF timing control circuits. The detector 1000 may be formed on the logic layer 1021 using the micro-transfer printing techniques. For example, a stamp may be used to break anchor structures to release the detector 1000 from a source wafer, adhere the detector 1000 to a surface of the stamp, and simultaneously transfer the multiple detector 1000 to respective logic layers 1021 by contacting the surface of the stamp including the detectors 1000 thereon with respective surfaces of the logic layers 1021, defining print interfaces 1015 therebetween. In some embodiments, the print interface 1015 between the detector 1000 and the logic layer 1021 may include an adhesive layer.

Though particular configurations of detector 1000 are illustrated in FIGS. 10A and 10B, it will be understood that other configurations are possible. For example, alternate configurations based on known implementations of photo detectors may be used, such as those based on pin, pinFET, linear APD, SiPM, electron-injection and/or SPAD devices. In some embodiments, the detector 1000 may be GaN-based, GaAs-based and/or InP-based, though the embodiments described herein are not limited thereto.

Figure 11A:
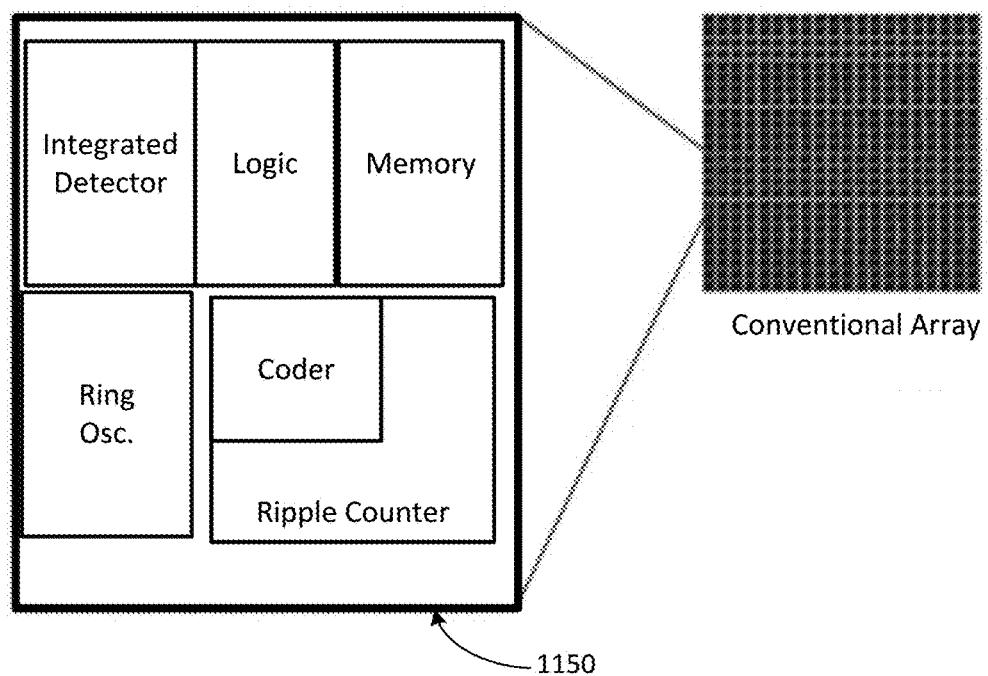
FIG. 11A illustrates an example of a conventional detector array.

FIG. 11A illustrates an example of a conventional detector array. As illustrated in FIG. 11A, a conventional detector structure 1150 may include an integrated detector and additional elements (e.g., logic, memory, a ring oscillator, etc.). However, the size of the integrated detector may be relatively small as compared to the size of the conventional detector structure 1150. In some conventional arrangements, the fill factor (e.g., the ratio of the area of the integrated detector to the area of the conventional detector structure 1150) may be as low as 20%.

Figure 11B:
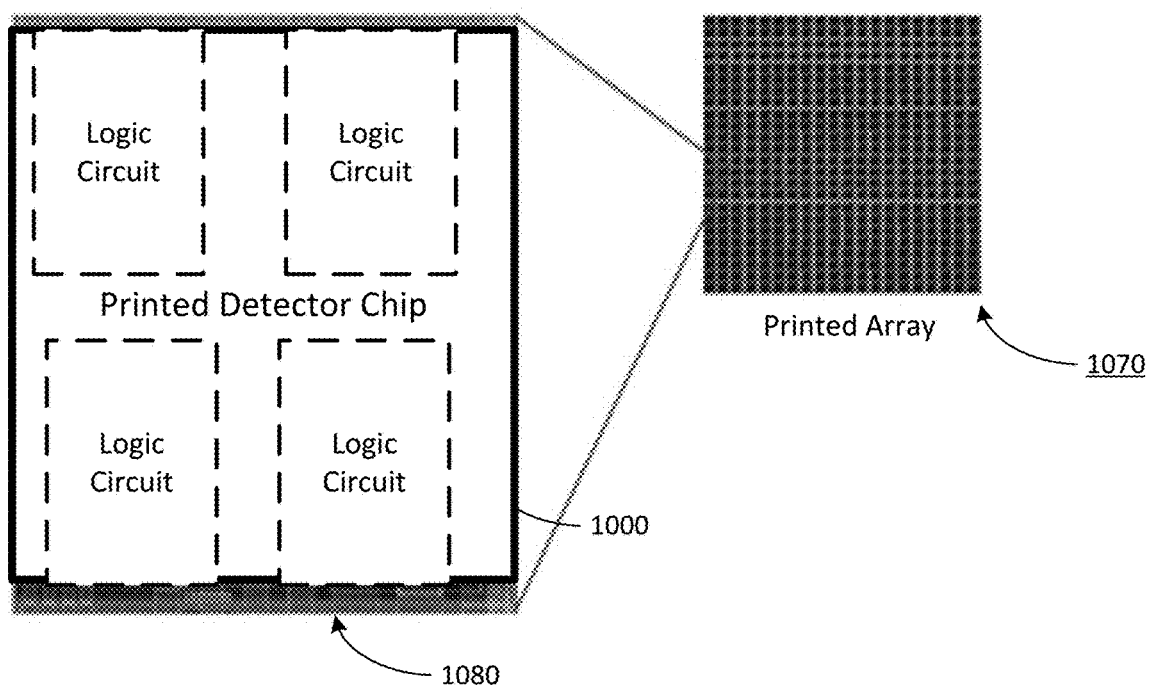
FIG. 11B illustrates an example of a detector array and individual detector, according to some embodiments described herein.

FIG. 11B illustrates an example of a detector array 1070 and individual detector 1000, according to some embodiments described herein. In contrast to the conventional arrangement of FIG. 11A, detectors 1000 printed using an MTP process, electrostatic adhesion, or other mass transfer technique may result in the ability to arrange the detectors 1000 on the supporting logic circuit (illustrated in dashed lines) for the detectors 1000 to create a detector structure 1080. For example, the electrical circuits for elements supporting the detector 1000 (e.g., logic, memory, etc.) may be formed first on a source substrate, and the detector 1000 may be printed using the MTP process on an upper surface of the electrical circuits to create a detector structure 1080. As a result, a fill factor (e.g., the ratio of the surface area of the detector 1000 to the surface area of the detector structure 1080) for a detector structure 1080 utilizing an MTP process as described herein may approach 80% or more. In some embodiments, the fill factor may be greater than or equal to 90%. By using the individual detectors 1000 with the increased fill factor, the detectors 1000 may be arranged in an array 1070 that occupies less area than a conventional array.

Figure 11C:
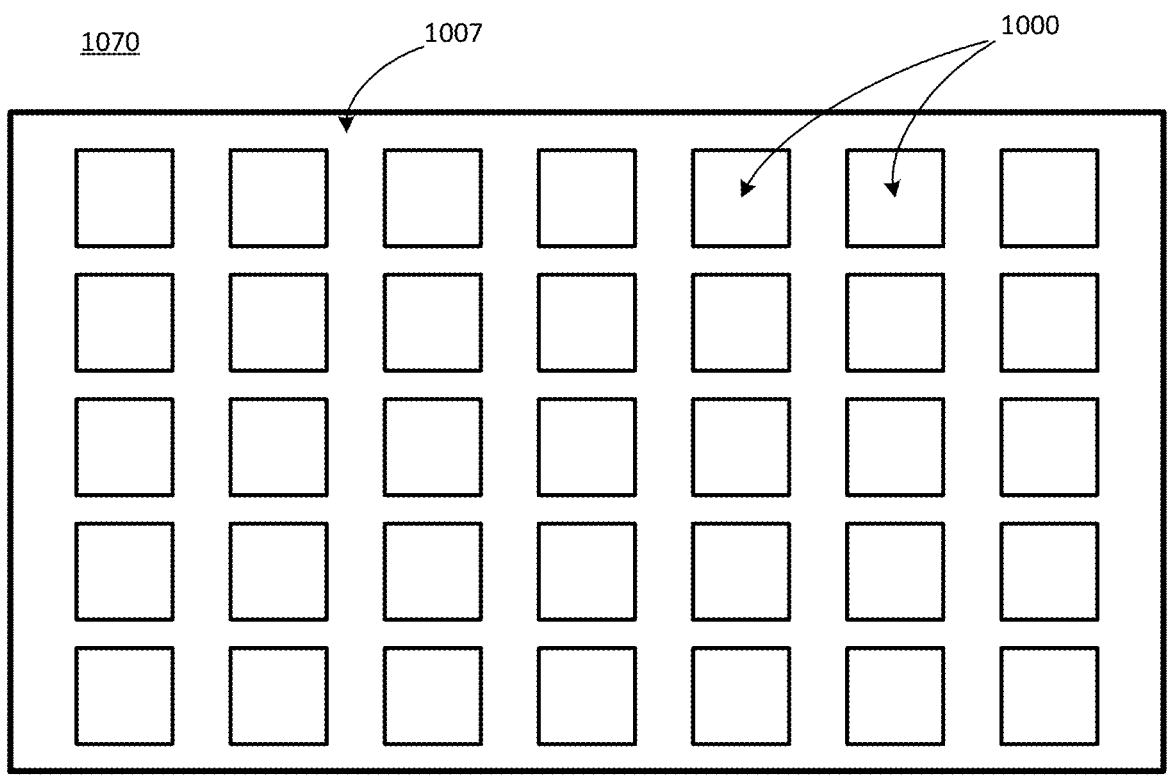
FIG. 11C illustrates a schematic representation of a distributed array of detectors printed on a non-native substrate, according to some embodiments described herein.

FIG. 11C illustrates a schematic representation of a distributed array 1070 of detectors 1000 printed on a non-native substrate 1007, according to some embodiments described herein. As illustrated in FIG. 11C, the detectors 1000 may be arranged in a row-column architecture. In some embodiments, the individual detectors 1000 may be separately addressable, as discussed with respect to FIGS. 6B and 6D. In other words, control elements may be added to allow for the individual addressability of individual detectors 1000 of the detector array 1070.

As discussed herein with respect to FIGS. 6A-6D, the respective detectors 1000 may be connected with conductive thin-film interconnects. Due to the small dimensions of the detectors 1000 and the connections provided by the conductive thin-film interconnects, a spacing between two immediately adjacent detectors 1000 may be less than about 150 micrometers (μm). In some embodiments, the spacing between two immediately adjacent detectors 1000 may be less than 5 μm, or in some embodiments, less than about 20 μm, or less than about 30 μm. In addition, as described herein with reference to the examples of FIGS. 6A-6D, some embodiments of the present disclosure may integrate other types of devices and/or devices formed from different materials (e.g. power capacitors, FETs, etc.) in-between detectors 1000 at the sub-150 μm spacings described herein.

Figure 12A:
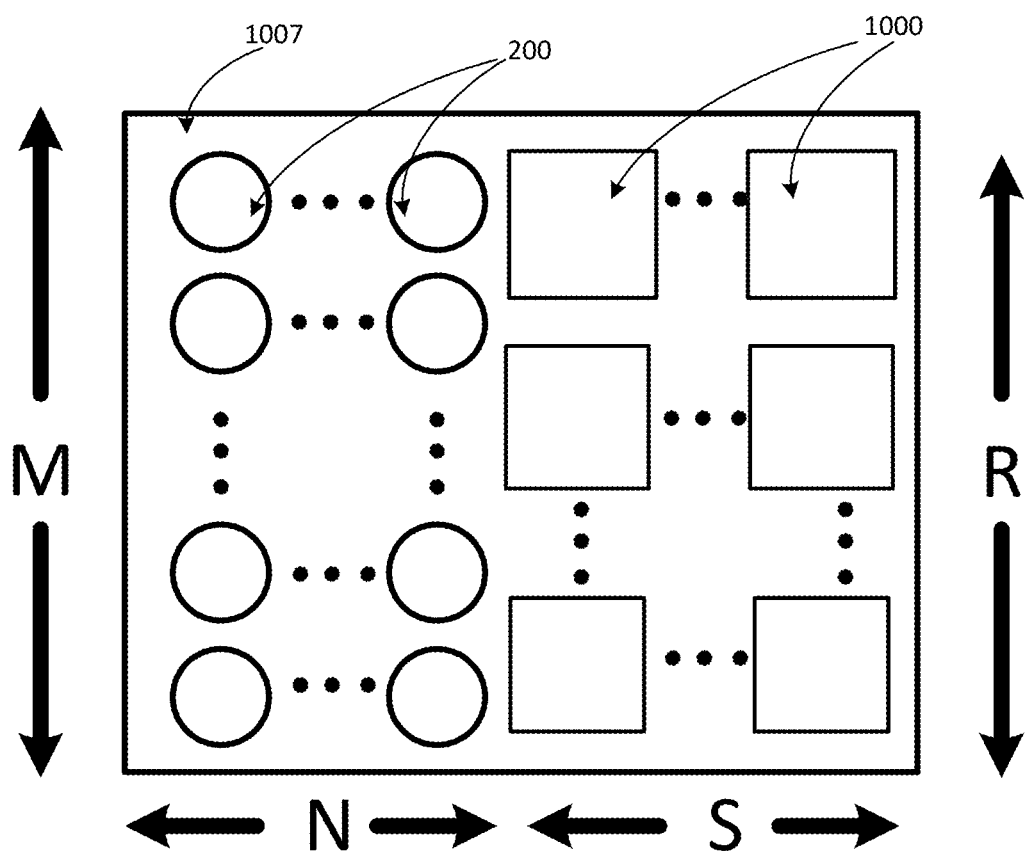
FIG. 12A illustrates a schematic representation of a combination of emitters and detectors heterogeneously integrated on a non-native substrate, according to some embodiments described herein.

In some embodiments, MTP, electrostatic adhesion, or other mass transfer processing may be used to arrange individual detectors 1000 and individual VCSELs 200 on a common substrate. FIG. 12A illustrates a schematic representation of a combination of VCSELs 200 and detectors 1000 heterogeneously integrated on a non-native substrate 1007, according to some embodiments described herein. As illustrated in FIG. 12A, a plurality of VCSELs 200 may be arranged adjacent a plurality of detectors 1000. For convenience of illustration, only representative images are provided for the VCSELs 200 and detectors 1000. However, it will be understood that the VCSELs 200 may be provided in an array of M rows by N columns, where M and N are integers of 1 or greater. Similarly, the detectors 1000 may be provided in R rows by S columns, where R and S are integers of 1 or greater. In some embodiments, M may be equal to R and/or N may be equal to S, but the embodiments described herein are not limited thereto. In some embodiments, M may be different than R, and N may be different than S.

As previously described, use of the MTP, electrostatic adhesion, or other mass transfer process allows for the placement of the VCSELs 200 and detectors 1000 on the non-native substrate 1007 in series or parallel configurations, and the forming of electrical interconnects between the various devices, such as the thin-film electrical interconnects 613 of FIG. 6A. The non-native substrate 1007 may be rigid or flexible, and may include integrated driver transistors, such as integrated driver transistors discussed with respect to FIGS. 6A-6D. The arrangement of the VCSELs 200 adjacent the detectors 1000 allows for both devices to be commonly provided on a single substrate. Given the reduced size of both the VCSELs 200 and the detectors 1000, the embodiments described herein provide a dense distributed array capable of supporting both the emission and detection of laser signals.

Figure 12B:
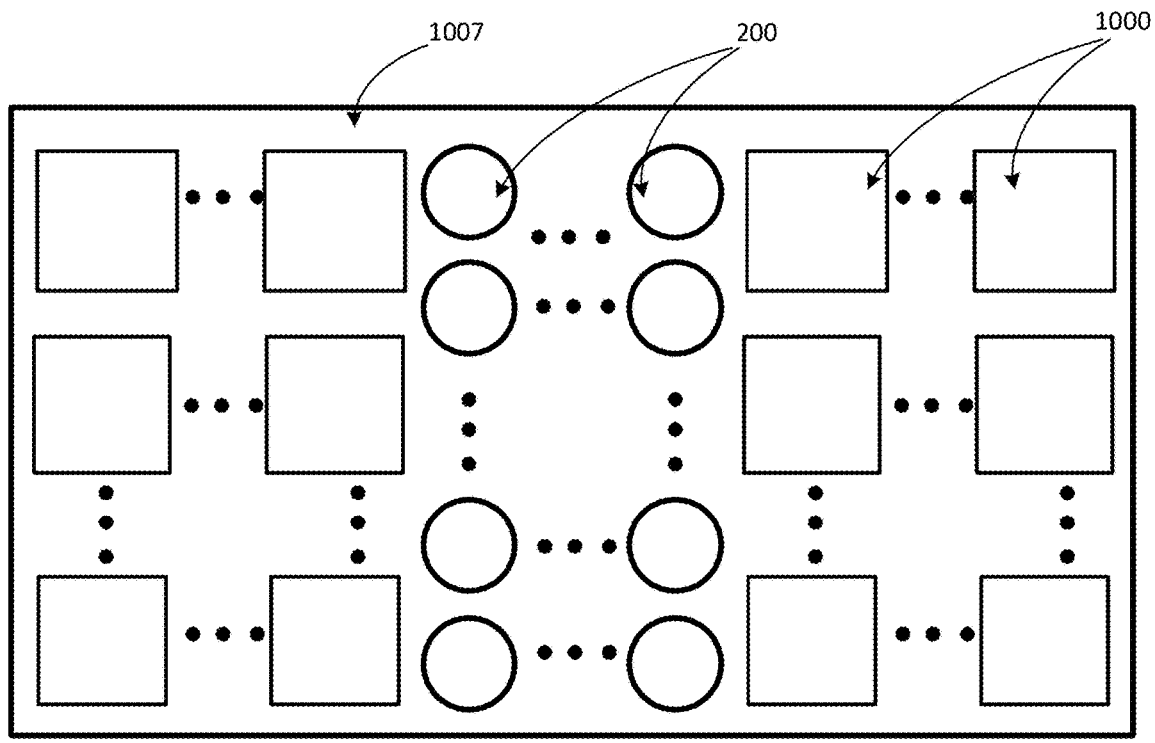
FIGS. 12B and 12C illustrate example configurations in which arrays of VCSELs and detectors are variously arranged, according to some embodiments described herein.
Figure 12C:
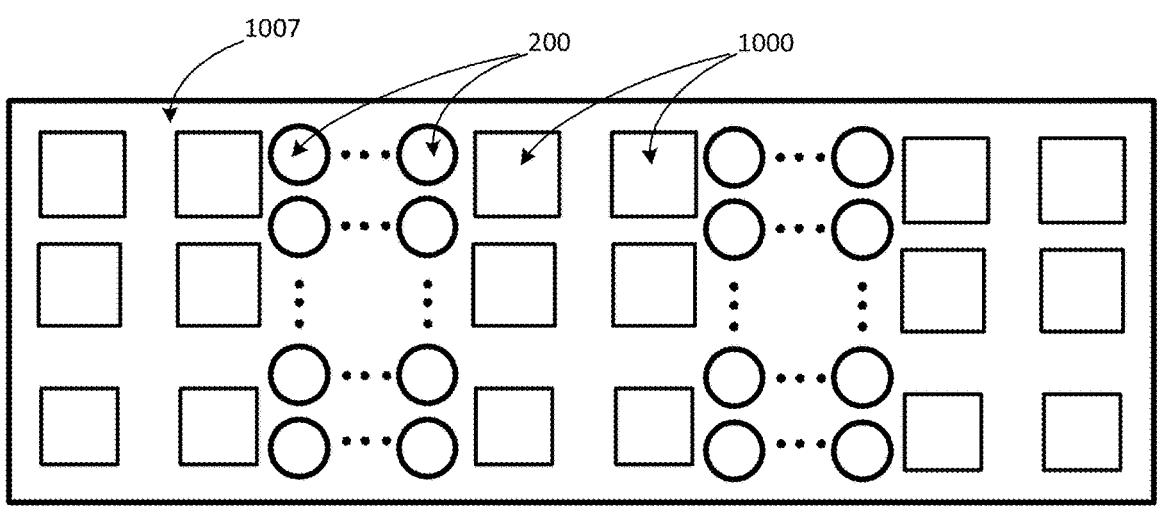

Though FIG. 12A illustrates a configuration in which an array of VCSELs 200 is adjacent an array of detectors 1000, it will be understood that other configurations are available. For example, FIGS. 12B and 12C illustrate example configurations in which arrays of VCSELs 200 and detectors 1000 are variously arranged, according to some embodiments described herein. FIG. 12B illustrates a configuration in which a single array of VCSELs 200 is flanked on both sides by arrays of detectors 1000. FIG. 12C illustrates a configuration including multiple arrays of both VCSELs 200 and detectors 1000. In some embodiments, a spatial density or concentration of one or more of the arrays of detectors 1000 may differ from other ones of the arrays of detectors 1000. For example, spatial density or concentration of detectors 1000 at peripheral portions of the non-native substrate 1007 may be less than a concentration of VCSELs 200 at a central portion of the non-native substrate 1007. Having reduced detection capability at peripheral portions of the non-native substrate 1007 may provide a lower resolution, and a subsequent lower power consumption, at peripheral portions of the field of view where higher detail may not be necessary. It will be understood by those of skill in the art that other configurations of VCSELs 200 and detectors 1000 are possible utilizing the MTP process without deviating from the embodiments described herein.

Figure 13A:
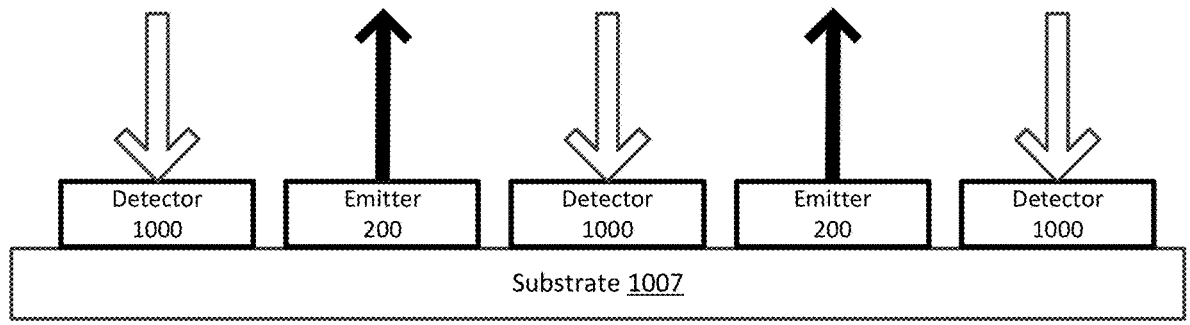
FIGS. 13A and 13B illustrate examples of heterogeneous configurations of VCSELs and detectors on a non-native substrate, according to some embodiments described herein.
Figure 13B:
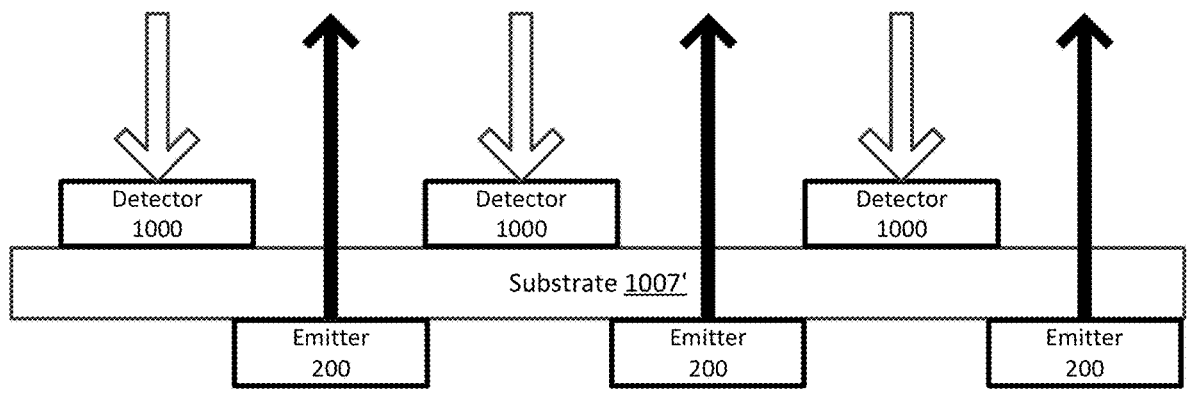

FIGS. 13A and 13B illustrate examples of heterogeneous configurations of emitters 200 and detectors 1000 on a non-native substrate 1007, according to some embodiments described herein. In some embodiments, the emitters 200 may be VCSEL emitters as described herein. As illustrated in FIG. 13A, emitters 200 and detectors 1000 may be arranged on a same side of the non-native substrate 1007. Individual emitters 200 may emit light in a direction that extends away from the non-native substrate 1007. In some embodiments, the emitters 200 may emit light substantially perpendicular to the surface of the non-native substrate 1007, but the embodiments described herein are not so limited. For example, in some embodiments, the emitters 200 may be mounted at an angle to the non-native substrate 1007. In some embodiments, the emitters 200 may be edge-emitting laser structures.

The detectors 1000 may be mounted on a same side of the non-native substrate 1007 as the emitters 200. In some embodiments, both the emitters 200 and the detectors 1000 may be mounted to the same side of the non-native substrate 1007 via an MTP process as described herein. The detectors 1000 may detect incident light that is directed towards the surface of the non-native substrate 1007. The detectors 1000 may be configured to detect reflections of the laser light emitted by emitters 200 so as to form a data representation of the environment illuminated by the laser light emitted by the emitters 200. The arrangement of the emitters 200 and detectors 1000 in FIG. 13A are intended as examples, and the embodiments described herein are not limited to the particular arrangement illustrated in FIG. 13A.

FIG. 13B illustrates an example in which the emitters 200 and the detectors 1000 are mounted on opposites sides of the non-native substrate 1007'. In some embodiments, the non-native substrate 1007' may be transparent with respect to at least the emission wavelengths of the light output from the emitters 200. The emitters 200 may be configured to emit laser light through the non-native substrate 1007'. For example, the emitters 200 may be VCSEL emitters such as the one illustrated in FIG. 2B, and the emitter 200 may be mounted so that the aperture of the emitter 200 faces the non-native substrate 1007'. Similarly, the emitter 200 could be an edge-emitting laser structure such as the one illustrated in FIG. 9, and the mirrors (see FIG. 9) may be arranged so as to reflect emitted light through the non-native substrate 1007'.

The detectors 1000 may be mounted on the opposite side of the non-native substrate 1007' as the emitters 200. In some embodiments, both the emitters 200 and the detectors 1000 may be mounted to opposite sides of the non-native substrate 1007' via an MTP process as described herein. The detectors 1000 may detect incident light that is direct towards the surface of the non-native substrate 1007 in a similar manner as described with respect to FIG. 13A. In some embodiments, the emitters 200 may be arranged so as to emit light through portions of the non-native substrate 1007 that are not occupied by detectors 1000 or other circuit elements. In other words, the emitters 200 may be placed so as to radiate laser light through portions of the non-native substrate 1007 in which the laser light will not be impeded by other structures on the non-native substrate 1007.

By placing at least some of the emitters 200 and detectors 1000 on opposite sides of the non-native substrate 1007', the overall size of the heterogeneous array of emitters 200 and detectors 1000 may be reduced. In addition, placing at least some of the emitters 200 and detectors 1000 on opposite sides of the non-native substrate 1007 may improve thermal performance of the heterogeneous array of emitters 200 and detectors 1000 by increasing the distance between adjacent elements (e.g., emitters 200 and/or detectors 1000). The arrangement of the emitters 200 and detectors 1000 in FIG. 13A are intended as examples, and the embodiments described herein are not limited to the particular arrangement illustrated in FIG. 13B.

Referring back to FIG. 2B, VCSELs 200 may be implemented using long wavelength materials (e.g., which emit light over a wavelength range of about 1100 nm to about 1600 nm or more) for the active region 205. In some embodiments, the VCSELs 200 may be implemented using short wavelength materials (e.g., which emit light over a wavelength range of about 350 nm to about 450 nm, or less) for the active region 205. In some embodiments, VCSELs 200 implemented using short wavelength materials may be combined in a distributed array with VCSELs 200 implemented using long wavelength materials. That is, a heterogeneous array may include multiple laser diodes 200, 200' that emit light in different wavelength ranges.

For example, in LIDAR applications, intensity data from multiple lasers having different emission wavelengths may allow for improved differentiation of materials, based for instance on differences in target reflectance for the different wavelengths. However, fabricating arrays including lasers of different emission wavelengths may involve challenges. For example, the physical length (and thus, the optical path length as a function of the physical length and the refractive index) of the optical cavity may be different for lasers of different emission wavelengths. For a VCSEL 200 configured to emit shorter-wavelength light, the DBR layers 201, 202 may be selected for the shorter wavelength active regions 205 (e.g., GaN). For a VCSEL 200 configured to emit longer wavelength light, the materials of the DBR layers 201, 202 may be selected for the longer wavelength active regions 205 (e.g., InP). Mechanisms for constructing VCSELs 200 of different wavelengths are discussed in co-pending U.S. patent application Ser. No. 15/951,727 entitled "Emitter Structures for Ultra-Small Vertical Cavity Surface Emitting Lasers (VCSELs) and Arrays Incorporating the Same," the entire contents of which are incorporated herein by reference.

FIGS. 14A-14D illustrate arrays in which emitters and detectors of different wavelengths may be combined in heterogeneous arrays, according to some embodiments described herein. As shown in the perspective view of FIG. 14A, laser diodes 200 and 200' that emit light in different wavelength ranges may be heterogeneously-interspersed on a substrate 1007 in the same array 1210a. Additionally or alternatively, laser diodes 200 and 200' that emit light in different wavelength ranges may be assembled in respective sections or areas 1195 and 1295 of the same array 1210b, as shown in the perspective view of FIG. 14B. That is, multi-wavelength laser diode arrays 1210a, 1210b in accordance with embodiments described herein may include multiple lasers of different wavelengths that are homogeneously arranged in respective sections and/or heterogeneously interspersed throughout one or more sections of an array substrate 1007. Also, in some embodiments, a concentration of the laser diodes 200 and/or 200' per area of the arrays 1210a, 1210b may differ at different sections of the array, for example, as may benefit some LIDAR sensor applications that provide higher resolution (via a greater concentration of laser diodes 200 and/or 200') in a central portion of the array corresponding to a forward direction of travel, but lower resolution (via a lesser concentration of laser diodes 200 and/or 200') at peripheral regions of the array. Additionally or alternatively, the curvature of the substrate 1007 may be configured to provide a desired power distribution; for example, the substrate 1007 may define a cylindrical, acylindrical, spherical or aspherical curve whose normal surfaces provide a desired distribution of relative amounts of power. In some embodiments, the curvature of the substrate 1007 may be dynamically altered, in a manner similar as discussed above with reference to the substrate 307b of FIG. 3B.

Figure 14A:
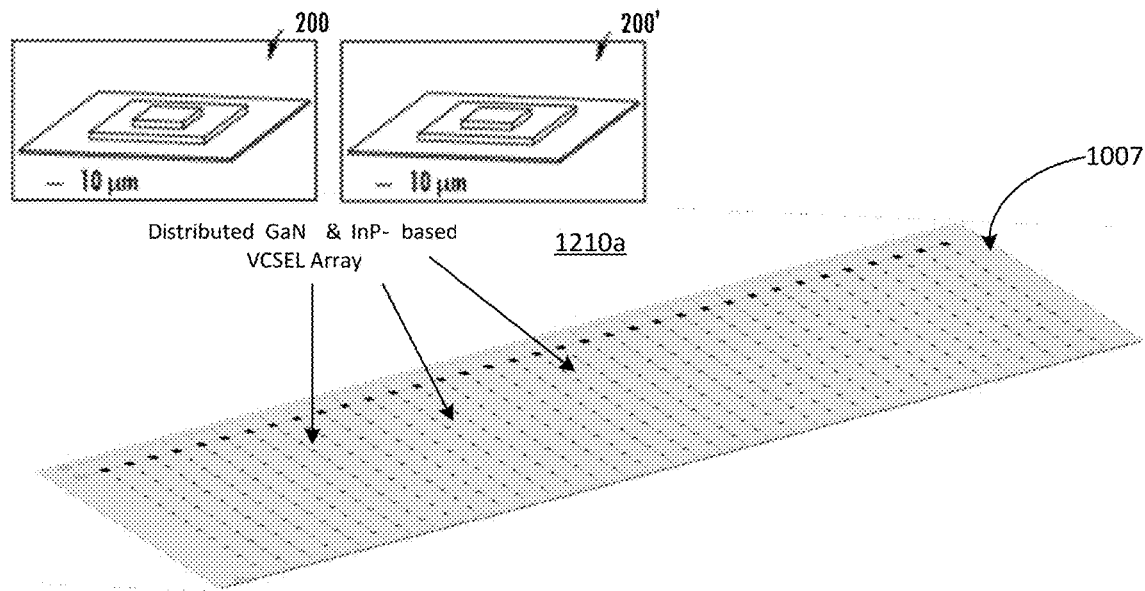
FIGS. 14A-14D illustrate arrays in which emitters and detectors of different wavelengths may be combined in heterogeneous arrays, according to some embodiments described herein.
Figure 14B:
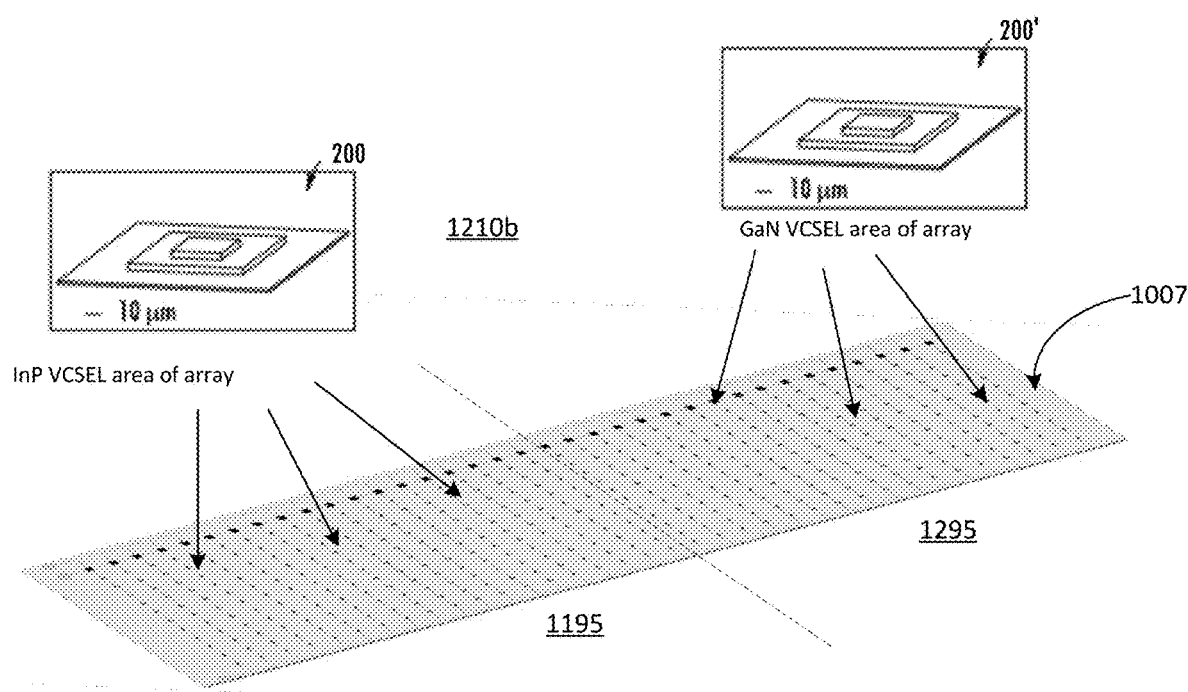

The arrays 1210a, 1210b illustrated by way of example in FIGS. 14A and 14B may include hundreds or thousands of closely-spaced VCSELs 200, 200', some of which may be electrically connected in series or in parallel configurations. For example, multiple VCSELs 200, 200', in accordance with some embodiments described herein, may be assembled and electrically connected in series within the footprint of the conventional VCSEL chip 10 of FIG. 2C. Electrically conductive thin-film interconnects may be formed to electrically connect respective contacts of the VCSELs 200, 200' in series and/or parallel configurations, and may be similar to the interconnects 213 described above. The conductive thin-film interconnects may be formed in a parallel process, before, after, or between fabrication of one or more sublayers of the laser diodes 200, 200' on the substrate 1007, for instance, by patterning an electrically conductive film using conventional photolithography techniques. The laser diodes 200, 200' may thus be free of electrical connections through the substrate 1007. Due to the small dimensions of the laser diodes 200, 200' and the connections provided by the conductive thin-film interconnects, a spacing between two immediately adjacent laser diodes 200, 200' may be less than about 150 micrometers ($\mu$m), or in some embodiments, less than about 100 $\mu$m, or less than about 50 $\mu$m, without connections to a shared or common cathode/anode.

The VCSELs 200, 200' may further integrate devices and/or devices formed from different materials (e.g. power capacitors, FETs, etc.) in-between VCSELs 200, 200' at the sub-150 $\mu$m spacings described herein, for example, in a manner similar to the arrangements described above with reference to the distributed array 600 and driver transistors 610 of FIGS. 6A-6D. Likewise, the VCSELs 200, 200' and/or sublayers thereof may be fabricated using any of the techniques described above with reference to FIGS. 4A-4F and 4A'-4H'. More generally, the fabrication techniques, device integration, and/or non-native substrate characteristics described herein with reference to particular laser diode structures (and/or sublayers thereof) may be used to fabricate any of the laser diode structures, sublayers thereof, and/or laser arrays described herein.

Figure 14C:
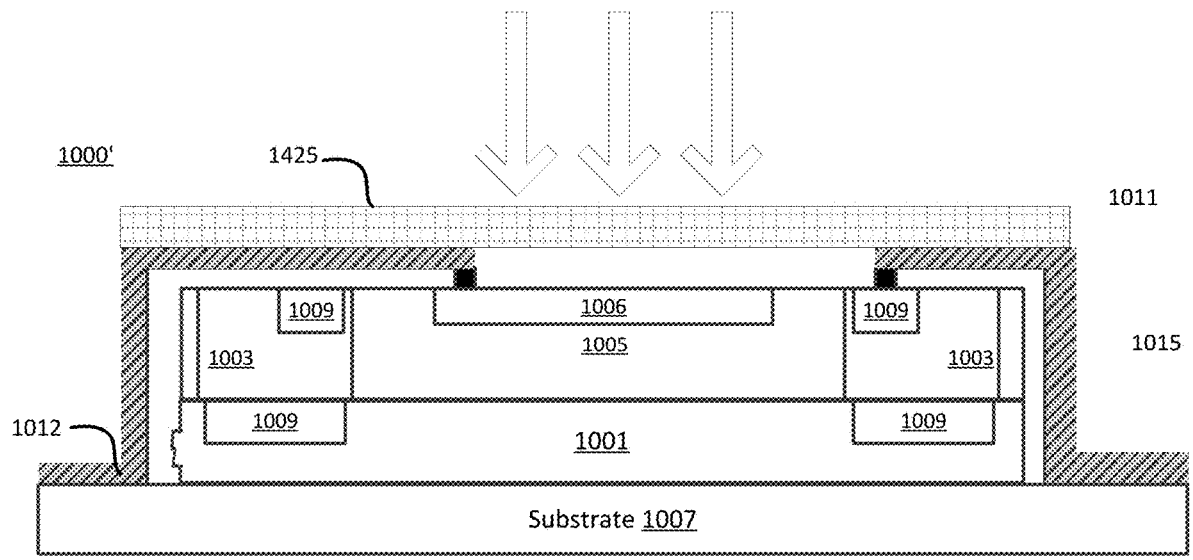
Figure 14D:
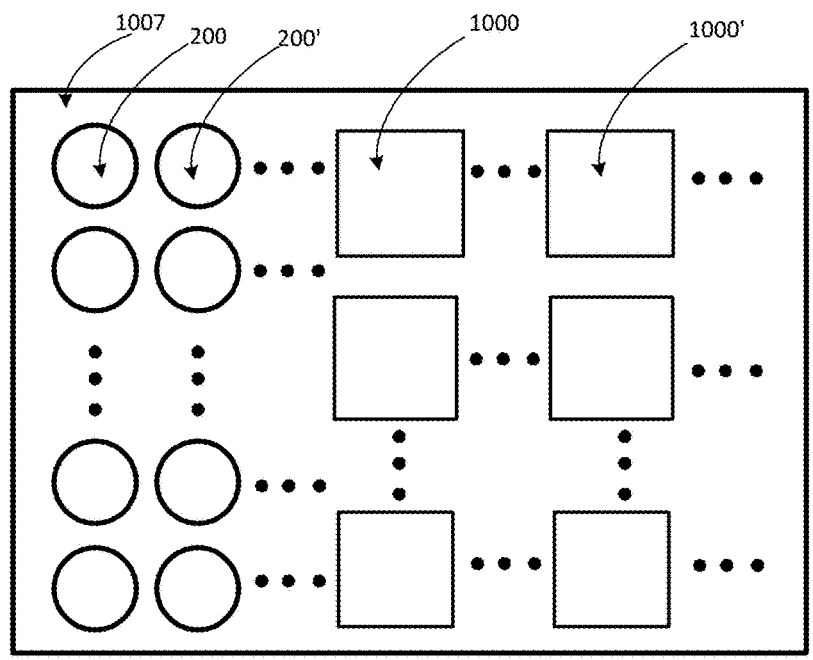

In some embodiments, the detectors 1000 described herein may be configured to detect light emitted from laser diodes 200, 200' having multiple wavelengths. Thus, in some embodiments, the detector 1000 described herein may be combined in heterogeneous arrays with laser diodes 200 and/or 200'. In some embodiments, a detector 1000' may be configured to detect particular wavelengths. FIG. 14C illustrates a detector 1000' which has been configured to detect only or primarily light of a particular wavelength. The detector 1000' of FIG. 14C may operate similarly to the detector 1000 of FIG. 10, and descriptions of duplicate portions are omitted for brevity. In the detector 1000' tuned for a particular wavelength, a filter 1425 may be added to be on and, in some embodiments cover, portions of the detector 1000' that are configured to detect emitted light. In some embodiments, the filter 1425 may be applied to the detector 1000' via an MTP process. In some embodiments, a particular detector 1000' may be configured to detect a particular wavelength of emitted light from a particular emitter 200, 200'. As illustrated in FIG. 14D, an array of detectors 1000 configured to detect light of multiple wavelengths and/or detectors 1000' configured to detect light of a particular wavelength, may be combined, along with VCSELs 200, 200' in an array on a substrate 1007. In some embodiments, as discussed herein, an MTP process may be used to arrange the VCSELs 200, 200' and the detectors 1000, 1000' on the substrate 1007 to create the heterogeneous array.

Figure 15A:
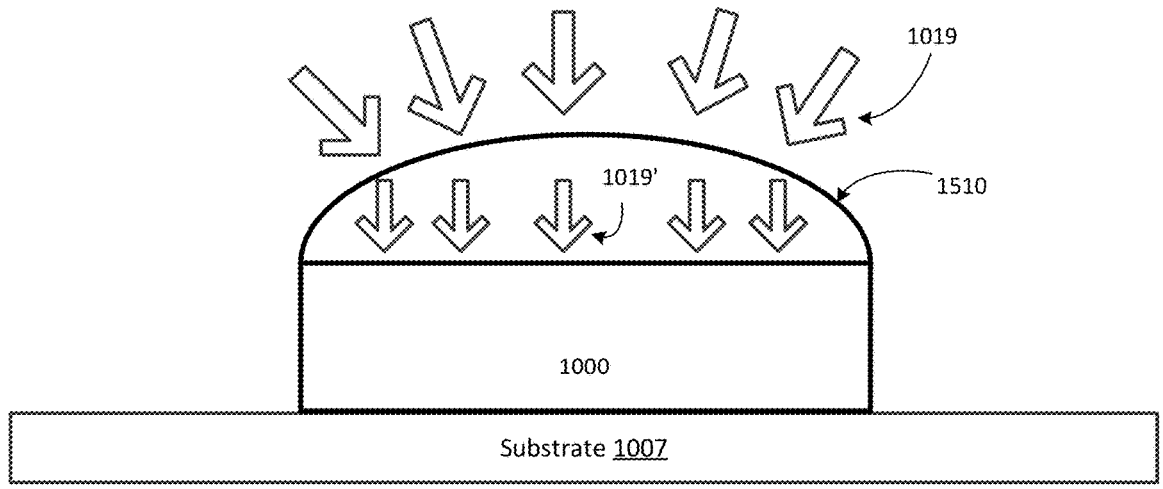
FIGS. 15A-15C illustrate examples of configurations of detectors that provide a wider field of view, according to some embodiments described herein.
Figure 15B:
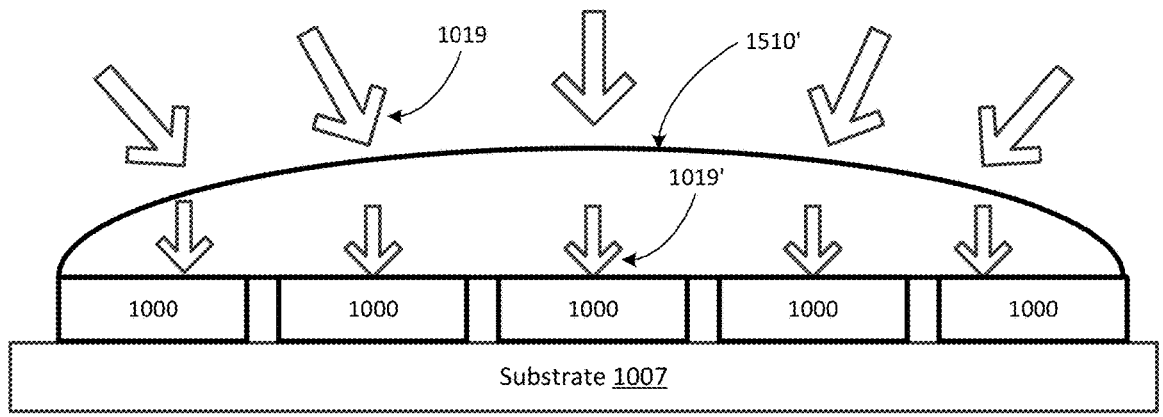
Figure 15C:
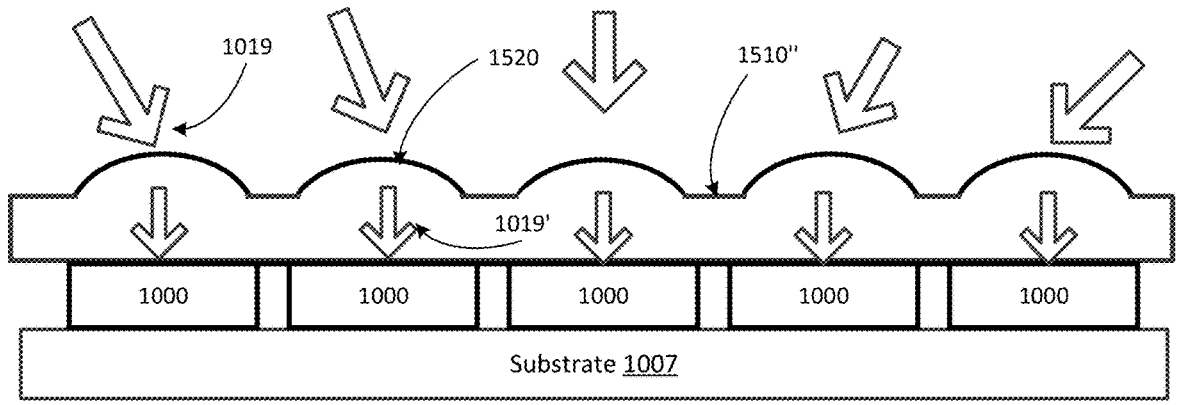

FIGS. 15A-15C illustrate examples of configurations of detectors 1000 that provide a wider field of view, according to some embodiments described herein. As illustrated in FIG. 15A, a lenslet 1510 may be provided on a detector 1000. The lenslet 1510 may allow for incident light 1019 to be concentrated into focused light 1019' that may be detected by the detector 1000. In a conventional configuration without the lenslet 1510, the amount of incident light 1019 detected by the detector 1000 may be a function of the location of that detector 1000 on the substrate 1007. The detector 1000 may be limited to detecting incident light 1019 that arrives that within a particular range of angles relative to a line normal to an upper surface of the detector 1000. For example, the detector 1000 may be capable of detecting incident light 1019 that is within 45 degrees of a line normal to the upper surface of the detector 1000 (e.g., an angle of incidence of 45 degrees). Thus, the detector 1000 may have difficulty detecting, or be unable to detect, incident light 1019 that arrives at greater angles. In other words, the detector 1000 may have a limited field of view (FOV).

Adding the lenslet 1510 may allow for the FOV of the detector 1000 to be increased. The lenslet 1510 may concentrate incident light 1019 arriving at a greater angle of incidence, and provide the focused incident light 1019' to the detector 1000 at a smaller angle of incidence. Thus, the FOV of the detector 1000 may be increased. By increasing the FOV, the detector 1000 may be able to collect light from a broader range. For example, in a LIDAR system, this may mean an increased width of detection in front of the LIDAR system. In some embodiments, the lenslet 1510 may be printed on the detector 1000 via an MTP process. In some embodiments, the lenslet 1510 may be formed of a glass lens element, a silicone-on-glass lens element, and/or other materials that are transparent at least to the incident light 1019.

Though FIG. 15A illustrates a unitary lenslet 1510 on the detector 1000, it will be understood that other configurations are possible. For example, as illustrated in FIG. 15B, a lenslet 1510' may be provided to cover a plurality of detectors 1000. FIG. 15C illustrates another configuration of a lenslet 1510" that may cover a plurality of detectors 1000. In the embodiment of FIG. 15C, individual lenslet features 1520 have been provided within the lenslet 1510". The lenslet 1510" with the individual lenslet features 1520 may allow for a wider FOV with equal distribution of the incident light 1019 across all, or many, of the individual detectors 1000. In some embodiments, the lenslet features 1520 may be defined in the surface of the lenslet 1510" by a molding, casting, embossing, and/or etching process.

Figure 16A:
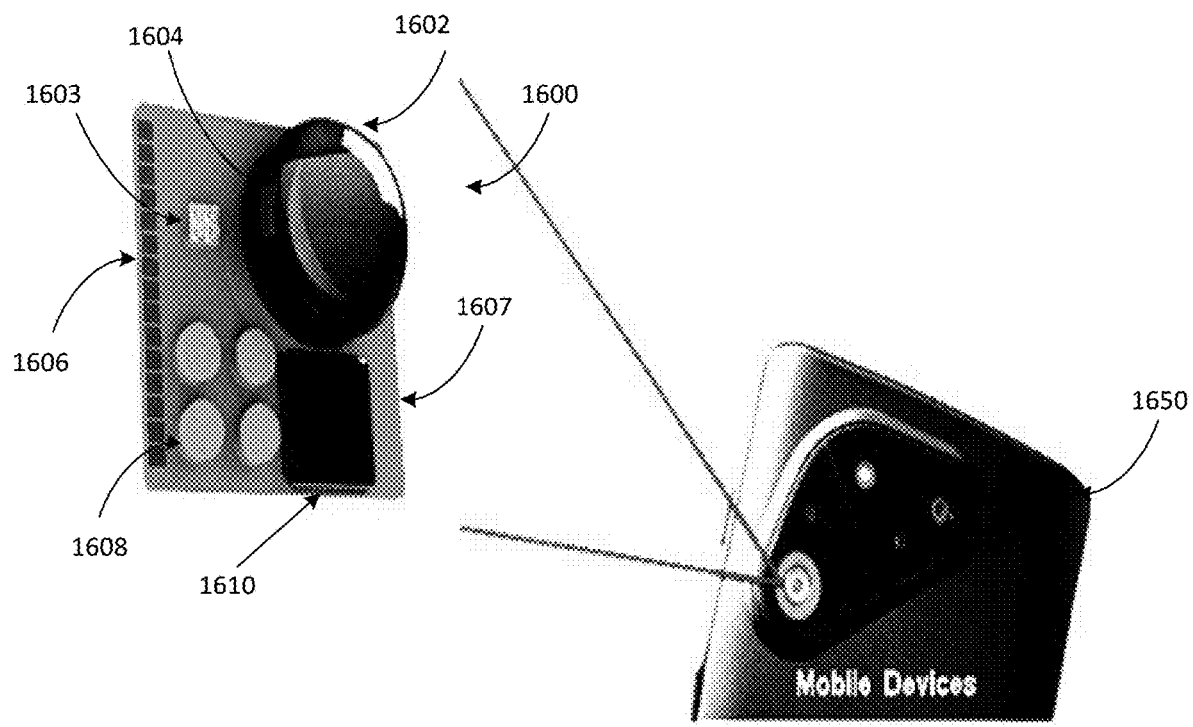
FIGS. 16A and 16B illustrate an integrated system-on-chip (SoC) incorporating the heterogeneous array of emitters and detectors, according to some embodiments described herein.
Figure 16B:
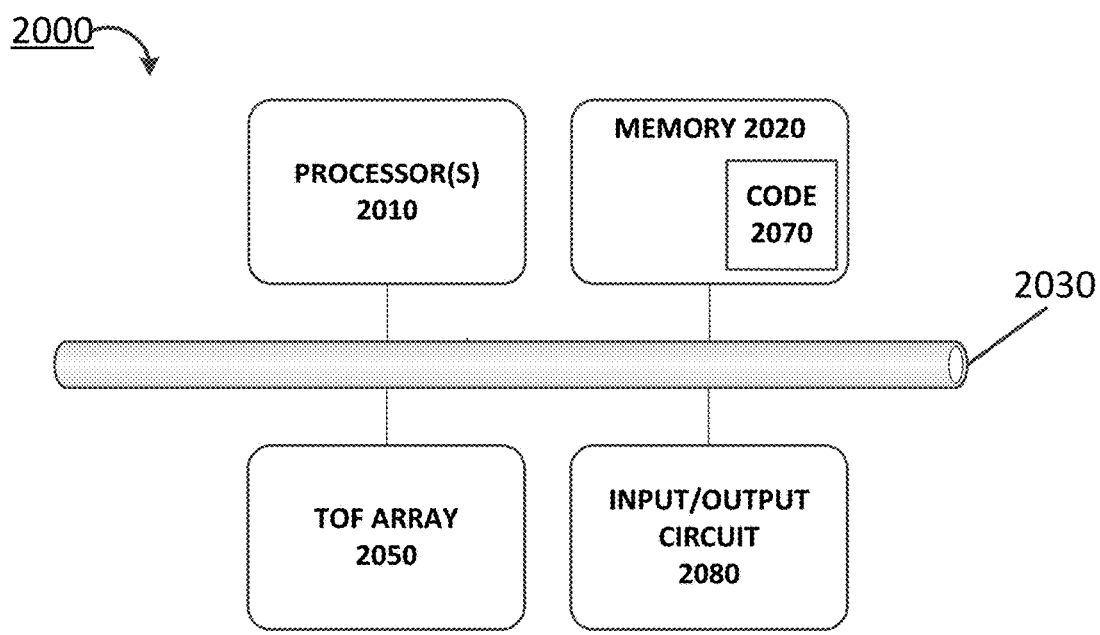

FIGS. 16A and 16B illustrate an integrated system-on-chip (SoC) 1600 incorporating the heterogeneous array of emitters and detectors, according to some embodiments described herein. As illustrated in FIG. 16A, the integrated SoC 1600 may be configured to provide ToF and/or detection functionality to an electronic device 1650. In some embodiments, the electronic device 1650 may be phone and/or camera. The integrated SoC 1600 may be configured to provide a complete solution that may be quickly and easily integrated into an existing electronic device 1650 to provide scanning and/or LIDAR functionality.

Referring to FIG. 16A, the integrated SoC 1600 may include a heterogeneous combination of detectors 1604 and emitters 1603 commonly provided on a substrate 1607. The emitters 1603 may be substantially the same as the VCSELs 200, 200' described herein. In some embodiments, the emitters 1603 may include laser emitters having a wavelength of 905 nm. The detectors 1604 may be substantially the same as the detectors 1000, 1000' described herein. In some embodiments, the emitters 1603 and/or the detectors 1604 may be printed on the substrate 1607 using an MTP process as described herein.

In some embodiments, the detectors 1604 may provided as an array behind a lens 1602. In some embodiments, the lens 1602 may be a wide-angle lens, and may include an integrated bandpass filter. The integrated SoC 1600 may further include a ToF timing control processor 1610 configured to control the emitters 1603 and detectors 1604. For example, the ToF timing control processor 1610 may control a timing and/or power level of the emitters 1603. Methods of controlling a beam generated by the emitters 1603 is discussed in co-pending U.S. patent application Ser. No. 15/951,824 entitled "Devices with Ultra-Small Vertical Cavity Surface Emitting Laser Emitters Incorporating Beam Steering," the entire contents of which are incorporated herein by reference. Methods of shaping a beam generated by the emitters 1603 is discussed in co-pending U.S. patent application Ser. No. 15/951,760 entitled "Beam Shaping for Ultra-Small Vertical Cavity Surface Emitting Laser (VCSEL) Arrays," the entire contents of which are incorporated herein by reference. In some embodiments, the ToF timing control processor 1610 may be configured to generate a 3D point cloud based on the operations of the emitters 1603 and detectors 1604.

The integrated SoC 1600 may further include charge storage elements 1608. The charge storage elements 1608 may be configured to store charges for driving/operating the emitters 1603 and/or detectors 1604. In some embodiments, the charge storage elements 1608 may be capacitors. The integrated SoC may further include an input/output port 1606. The input/output port 1606 may be configured to receive input in the form of control commands and provide output, such as to the electronic device 1650. In some embodiments, the input/output port 1606 may be used to provide a generated 3D point cloud based on the operation of the emitters 1603 and detectors 1604, though the present embodiments are not limited thereto. In some embodiments, the input/output port 1606 may be configured to provide output of other portions of the integrated SoC 1600, such as the detectors 1604, and the 3D point cloud may be generated by the electronic device 1650.

In some embodiments, the integrated SoC 1600 may provide a LIDAR system with a range of at least ten meters. The LIDAR system provided by the SoC 1600 may have a field of view of at least sixty degrees and a power output of 400 mW. The emitters 1603 and detectors 1604 of the SoC 1600 may provide a resolution of 1 degree or smaller. In some embodiments, the SoC 1600 may provide a resolution of about 0.1 degrees. Because of the use of the MTP process, the SoC may be capable of achieving a reduced form factor. In some embodiments, the form factor of the SoC 1600 may be 10×10×8 mm. In some embodiments, the width and/or length dimensions (e.g., in a direction parallel to a surface of the substrate 1607) of the SoC 1600 may be less than 2 mm.

FIG. 16B is a block diagram of an electronic apparatus 2000 capable of implementing the integrated SoC of FIG. 16A. The electronic apparatus 2000 may use hardware, software implemented with hardware, firmware, tangible computer-readable storage media having instructions stored thereon and/or a combination thereof, and may be implemented in one or more computer systems or other processing systems. As such, the devices and methods described herein may be embodied in any combination of hardware and software. In some embodiments, the electronic apparatus 2000 may be part of an imaging and/or LIDAR system.

As shown in FIG. 16B, the electronic apparatus 2000 may include one or more processors 2010 and memory 2020 coupled to an interconnect 2030. The interconnect 2030 may be an abstraction that represents any one or more separate physical buses, point to point connections, or both connected by appropriate bridges, adapters, or controllers. The interconnect 2030, therefore, may include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire."

The processor(s) 2010 may be, or may include, one or more programmable general purpose or special-purpose microprocessors, digital signal processors (DSPs), programmable controllers, application specific integrated circuits (ASICs), programmable logic devices (PLDs), field-programmable gate arrays (FPGAs), trusted platform modules (TPMs), or a combination of such or similar devices, which may be collocated or distributed across one or more data networks. The processor(s) 2010 may be configured to execute computer program instructions 2070 from the memory 2020 to perform some or all of the operations for one or more of the embodiments disclosed herein.

The electronic apparatus 2000 may also include one or more input/output circuits 2080 that may communicate with other electronic devices and/or one or more networks, including any conventional, public and/or private, real and/or virtual, wired and/or wireless network, including the Internet. The input/output circuits 2080 may include a communication interface and may be used to transfer information in the form of signals between the electronic apparatus 2000 and another electronic device. The input/output circuits 2080 may include a serial interface, a parallel interface, a network interface (such as an Ethernet card), a wireless interface, a radio interface, a communications port, a PCMCIA slot and card, or the like. These components may be conventional components, such as those used in many conventional computing devices, and their functionality, with respect to conventional operations, is generally known to those skilled in the art. In some embodiments, the input/output circuits 2080 may be used to transmit and/or receive data associated with the embodiments described herein.

The electronic apparatus 2000 may further include memory 2020 which may contain program code 2070 configured to execute operations associated with the embodiments described herein. The memory 2020 may include removable and/or fixed non-volatile memory devices (such as but not limited to a hard disk drive, flash memory, and/or like devices that may store computer program instructions and data on computer-readable media), volatile memory devices (such as but not limited to random access memory), as well as virtual storage (such as but not limited to a RAM disk). The memory 2020 may also include systems and/or devices used for storage of the electronic apparatus 2000.

The electronic device 2000 may also include a ToF array 2050. The ToF array 2050 may incorporate a heterogeneous array of individually addressable emitters and/or detectors. For example, the ToF array 2050 may include VCSELs such as the VCSELs 200, 200' and detectors 1000, 1000' discussed herein. The ToF array 2050 may be in communication with the processor(s) 2010 via the interconnect 2030. Thus, the processor(s) 2010 may be able to control the ToF array 2050 through execution of the code 2070 from the memory 2020.

The present invention has been described above with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element is referred to as being "on," "connected," or "coupled" to another element, it can be directly on, connected, or coupled to the other element, or intervening elements may be present. In contrast, when an element is referred to as being "directly on," "directly connected," or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments of the present invention described herein, and of the manner and process of making and using them, and shall support claims to any such combination or subcombination.

Although the invention has been described herein with reference to various embodiments, it will be appreciated that further variations and modifications may be made within the scope and spirit of the principles of the invention. Although specific terms are employed, they are used in a generic and descriptive sense only and not for purposes of limitation, the scope of embodiments of the present invention being set forth in the following claims.

The invention claimed is:

1. A semiconductor device comprising:
a plurality of laser emitters on a substrate, wherein the substrate is non-native to the plurality of laser emitters, and wherein a spacing between adjacent ones of the laser emitters is less than 500 μm; and
a detector structure, wherein the detector structure comprises:
an integrated circuit on the substrate; and
a plurality of photo detectors on an upper surface of the integrated circuit that is opposite the substrate, wherein the substrate is non-native to the photo detector, and
wherein a ratio of a first area of the plurality of photo detectors to a second area of the detector structure is greater than 80%.

2. The semiconductor device of claim 1, wherein the plurality of laser emitters and the detector structure are disposed on opposing surfaces of the substrate.

3. The semiconductor device of claim 2, wherein the plurality of laser emitters are configured to emit light through the substrate.

4. The semiconductor device of claim 1, wherein a spacing between adjacent photo detectors of the plurality of photo detectors is less than 20 μm, and
wherein the plurality of photo detectors comprises a pin, a pinFET, a linear avalanche photodiode (APD), a silicon photomultiplier (SiPM), and/or a single photon avalanche diode (SPAD) device.

5. The semiconductor device of claim 4, wherein the plurality of photo detectors comprises a first array of photo detectors having a first density and a second array of photo detectors having a second density, different from the first density.

6. The semiconductor device of claim 1, wherein at least one of the plurality of photo detectors comprises a broken tether portion and/or a relief feature at a periphery thereof.

7. The semiconductor device of claim 1, further comprising a lenslet on at least one of the plurality of photo detectors.

8. A System-on-Chip apparatus comprising:
at least one laser emitter on a non-native substrate;
a plurality of photo detectors on the non-native substrate; and
an input/output circuit,
wherein the plurality of photo detectors is disposed on an integrated circuit between the plurality of photo detectors and the non-native substrate to form a detector structure,
wherein a spacing between adjacent photo detectors of the plurality of photo detectors is less than 150 μm.

9. The apparatus of claim 8, wherein a ratio of a first area of the plurality of photo detectors to a second area of the detector structure is greater than 80%.

10. The apparatus of claim 8, further comprising a timing control processor coupled to the at least one laser emitter, the plurality of photo detectors, and the input/output circuit.

11. The apparatus of claim 8, wherein a surface of the non-native substrate having the at least one laser emitter and the plurality of photo detectors thereon has a width and/or a length of less than 2 millimeters.

12. The apparatus of claim 8, wherein the input/output circuit is configured to provide a 3D point cloud based on an operation of the at least one laser emitter and the plurality of photo detectors.

13. A semiconductor device comprising:
a substrate;
at least one laser emitter on the substrate, the at least one laser emitter configured to emit light, wherein the substrate is non-native to the at least one laser emitter; and
a plurality of photo detectors on the substrate, wherein the substrate is non-native to each of the plurality of photo detectors,
wherein the plurality of photo detectors are configured to detect a portion of the light from the at least one laser emitter that is reflected from a target,
wherein each of the plurality of photo detectors is on circuitry comprising a logic layer that is between the plurality of photo detectors and the substrate, and
wherein a spacing between adjacent photo detectors of the plurality of photo detectors is less than 150 μm.

14. The semiconductor device of claim 13, wherein the at least one laser emitter and the plurality of photo detectors are disposed on opposing surfaces of the substrate.

15. The semiconductor device of claim 14, wherein the at least one laser emitter is configured to emit the light through the substrate.

16. The semiconductor device of claim 13, wherein at least one of the plurality of photo detectors comprises a broken tether portion and/or a relief feature at a periphery thereof.

17. The semiconductor device of claim 13, wherein the at least one laser emitter is adjacent at least one of the plurality of photo detectors on a same side of the substrate.

18. A semiconductor device comprising:
a substrate;
at least one laser emitter on the substrate, the at least one laser emitter configured to emit light, wherein the substrate is non-native to the at least one laser emitter; and
a plurality of photo detectors on the substrate, wherein the substrate is non-native to each of the plurality of photo detectors,
wherein the plurality of photo detectors are configured to detect a portion of the light from the at least one laser emitter that is reflected from a target,
wherein each of the plurality of photo detectors is on circuitry comprising a logic layer that is between the plurality of photo detectors and the substrate, and
wherein the at least one laser emitter is a plurality of laser emitters having a spacing between adjacent ones of the laser emitters that is less than 500 μm.

19. The semiconductor device of claim 18, wherein the at least one laser emitter is adjacent at least one of the plurality of photo detectors on a same side of the substrate.

20. The semiconductor device of claim 18, wherein the at least one laser emitter and the plurality of photo detectors are disposed on opposing surfaces of the substrate.

\* \* \* \* \*